US012648307B2

(12) United States Patent
Hwang et al.

(10) Patent No.: US 12,648,307 B2
(45) Date of Patent: Jun. 2, 2026

(54) DISPLAY DEVICE INCLUDING COLOR FILTER ON LIGHT-EMITTING ELEMENTS

(71) Applicant: Samsung Display Co., Ltd., Yongin-si (KR)

(72) Inventors: Seong Yong Hwang, Yongin-si (KR); Ji Hyun Kim, Yongin-si (KR); Chan Young Kim, Yongin-si (KR); Yeong Ho Lee, Yongin-si (KR); Jun Hee Lee, Yongin-si (KR); Choong Youl Im, Yongin-si (KR); Ha Seok Jeon, Yongin-si (KR); Hyun Duck Cho, Yongin-si (KR); Kook Hyun Choi, Yongin-si (KR); Beohm Rock Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 438 days.

(21) Appl. No.: 18/299,155

(22) Filed: Apr. 12, 2023

(65) Prior Publication Data
US 2024/0040848 A1 Feb. 1, 2024

(30) Foreign Application Priority Data
Jul. 26, 2022 (KR) ........................ 10-2022-0092496

(51) Int. Cl.
*H10K 59/122* (2023.01)
*H10K 59/38* (2023.01)
*H10K 59/80* (2023.01)

(52) U.S. Cl.
CPC ........... *H10K 59/122* (2023.02); *H10K 59/38* (2023.02); *H10K 59/8792* (2023.02)

(58) Field of Classification Search
None
See application file for complete search history.

(56) References Cited

U.S. PATENT DOCUMENTS 10,510,810 B2 12/2019 Kim et al.
11,522,160 B2 12/2022 Lee
(Continued)

FOREIGN PATENT DOCUMENTS

KR 10-2011-0080051 7/2011
KR 10-2016-0054720 5/2016
(Continued)

OTHER PUBLICATIONS

Communication dated Mar. 17, 2026 issued by the Korean Ministry of Intellectual Property in Korean Patent Application No. 10-2022-0092496.

*Primary Examiner* — Nduka E Ojeh
(74) *Attorney, Agent, or Firm* — Sughrue Mion, PLLC

(57) ABSTRACT

A display device comprises pixel electrodes disposed on a substrate and spaced apart from one another, a pixel-defining film disposed on the substrate and including openings, which are spaced apart from one another and overlap the pixel electrodes, organic light-emitting layers disposed in the openings of the pixel-defining film, a common electrode disposed between the pixel-defining film and the organic light-emitting layers, an encapsulation layer disposed on the common electrode, a light-blocking layer disposed on the encapsulation layer and including holes, which overlap the openings and are spaced apart from one another, and color filters disposed in the holes of the light-blocking layer and overlapping the openings. Sides of each of the openings have concave-convex patterns including convex portions that protrude outwardly and concave portions that are inwardly depressed. The color filters are disposed to partially overlap one another on the light-blocking layer.

23 Claims, 25 Drawing Sheets

(56) References Cited

U.S. PATENT DOCUMENTS

| | | | | |
|---|---|---|---|---|
| 12,532,632 | B2 | 1/2026 | Ma et al. | |
| 2018/0197921 | A1* | 7/2018 | Kim | H10K 59/38 |
| 2019/0181196 | A1* | 6/2019 | Dai | H10K 59/122 |
| 2022/0376213 | A1* | 11/2022 | Ma | H10K 59/38 |
| 2023/0411568 | A1* | 12/2023 | Lee | H10H 20/857 |
| 2025/0056968 | A1 | 2/2025 | Ma et al. | |

FOREIGN PATENT DOCUMENTS

| | | | |
|---|---|---|---|
| KR | 10-2018-0061853 | | 6/2018 |
| KR | 10 2018 0082661 | A | 7/2018 |
| KR | 10 2021 0070461 | A | 6/2021 |
| WO | 2021 254044 | A1 | 12/2021 |

* cited by examiner

CF: CF1, CF2, CF3

DISPLAY DEVICE INCLUDING COLOR FILTER ON LIGHT-EMITTING ELEMENTS

CROSS-REFERENCE TO RELATED APPLICATION(S)

This application claims priority to and benefits of Korean Patent Application No. 10-2022-0092496 under 35 U.S.C. § 119, filed on Jul. 26, 2022 in the Korean Intellectual Property Office, the entire contents of which are herein incorporated by reference.

BACKGROUND

1. Technical Field

The disclosure relates to a display device.

2. Description of the Related Art

As information society has developed, the demand for display devices for displaying images has diversified. For example, display devices have been applied to various electronic devices such as smart phones, digital cameras, notebook computers, navigation systems, and smart televisions. Such display devices may be flat panel display devices such as liquid crystal display (LCD) devices, field emission display (FED) devices, or light-emitting display devices. Here, the light-emitting display devices include light-emitting elements capable of emitting light, in pixels of display panels, and can display an image without a requirement of backlight units for providing light to the display panel.

SUMMARY

Aspects of the disclosure provide a display device including color filters on light-emitting elements, the structure of the display device being capable of reducing speckles that may be generated by the reflection of external light.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment of the disclosure, a display device may include pixel electrodes disposed on a substrate and spaced apart from one another, a pixel-defining film disposed on the substrate and including openings, which are spaced apart from one another and overlap the pixel electrodes, organic light-emitting layers disposed in the openings of the pixel-defining film, a common electrode disposed between the pixel-defining film and the organic light-emitting layers, an encapsulation layer disposed on the common electrode, a light-blocking layer disposed on the encapsulation layer and including holes, which overlap the openings and are spaced apart from one another, and color filters disposed in the holes of the light-blocking layer and overlapping the openings. Sides of each of the openings may include concave-convex patterns including convex portions that protrude outwardly and concave portions that are inwardly depressed. The color filters may be disposed to partially overlap one another on the light-blocking layer.

A pattern depth of the openings, which may be a sum of a length of the concave portions and a length of the protruding portions, may be about $\frac{1}{40}$ to about $\frac{1}{2}$ of an opening width of the openings, and a pattern width of the openings, which is a pattern width of the concave portions or the convex portions, may be about $\frac{1}{20}$ to about 1/1 of the opening width of the openings.

The pattern depth and the pattern width may be about 3 μm to about 5 μm.

The openings may have a same opening width in both a first direction and a second direction, which intersect each other, and sides, in the first direction, of each of the openings may have a same opening width-to-pattern width ratio as sides, in the second direction, of each of the openings.

The openings may have different opening widths in a first direction and a second direction, which intersect each other, and sides, in the first direction, of each of the openings may have a different opening width-to-pattern width ratio from sides, in the second direction, of each of the openings.

Each of the sides of each of the openings may include one concave portion.

The pattern depth of the openings may be about $\frac{1}{2}$ of the opening width of the openings.

The openings may include first and second openings, which are spaced apart from each other, an opening width of the first opening may differ from an opening width of the second opening, and a pattern width-to-opening width ratio of the first opening may differ from a pattern width-to-opening width ratio of the second opening.

Each side of each of the holes of the light-blocking layer may include convex portions that protrude outwardly and/or concave portions that are inwardly depressed to correspond to each of the sides of each of the openings.

Each side of each of the color filters may include convex portions that protrude outwardly and/or concave portions that are inwardly depressed to correspond to each of the sides of each of the holes.

The display device may further comprise spacers disposed between the pixel-defining film and the common electrode, wherein each side of each of the spacers may include convex portions that protrude outwardly and concave portions that are inwardly depressed to correspond to each of the sides of each of the openings.

Each side of each of the openings may include convex portions that protrude outwardly from an imaginary line extending across both ends of a corresponding side.

Each side of each of the openings may include concave portions that are inwardly depressed from an imaginary line extending across both ends of a corresponding side.

Each side, in a first direction, of each of the openings may include the convex portions, and each side, in a second direction, which intersects the first direction, may include the concave portions.

At least parts of the sides of each of the openings may be linear, and each of the openings may have protruding rounded corners where the sides of a corresponding opening meet.

The openings may include a first opening and a second opening, which are spaced apart from each other, and directions faced by protruding rounded corners of the first opening may differ from directions faced by protruding rounded corners of the second opening.

According to an embodiment of the disclosure, a display device may include pixels arranged in a first direction and a second direction, which intersect each other, each of the pixels including openings in which light-emitting elements are arranged, a light-blocking layer including holes, which are disposed in each of the pixels and overlap the openings, and color filters disposed in the holes of the light-blocking layer and overlapping the openings. The openings may include a first opening and a second opening, which are spaced apart from each other. The color filters may include a first color filter and a second color filter, which overlap the first and second openings, respectively. Each side of each of the first and second openings may include convex portions that protrude outwardly and/or concave portions that are inwardly depressed. The first and second color filters may be disposed to overlap each other on the light-blocking layer.

A pattern depth of the openings, which is a sum of a length of the concave portions and a length of the protruding portions, may be about 1/40 to about 1/2 of an opening width of the openings, and a pattern width of the openings, which is a pattern width of the concave portions or the convex portions, may be about 1/20 to about 1/1 of the opening width of the openings.

The pattern depth and the pattern width may be about 3 µm to about 5 µm.

The pixels may include a first pixel and a second pixel, which are adjacent to each other in the first direction, and positions of concave portions and convex portions of the first opening of the first pixel may be opposite to positions of concave portions and convex portions of the second opening of the second pixel.

At least parts of the sides of each of the openings may be linear, and each of the openings may have protruding rounded corners where the sides of a corresponding opening meet.

Protruding rounded corners of the first opening may face the first and second directions, and protruding rounded corners of the second opening may face diagonal directions between the first and second directions.

The pixels may include a first pixel and a second pixel, which are adjacent to each other in the first direction, and directions faced by protruding rounded corners oft the first opening of the first pixel may differ from directions faced by protruding rounded corners of the first opening of the second pixel.

According to the aforementioned and other embodiments of the disclosure, the sides of each of emission areas where light-emitting elements are disposed or the sides of each opening of a pixel-defining film may not be entirely linear, but at least partially curved or wavy with concave-convex patterns. Thus, in case that external light is reflected from electrodes on the pixel-defining film, the diffractive interference of the reflected external light can be dispersed. As a result, the reflected external light can be prevented from appearing as a repeated pattern or speckles, and a more satisfied feeling of use can be provided to a user.

It should be noted that the effects of the disclosure are not limited to those described above, and other effects of the disclosure will be apparent from the following description.

BRIEF DESCRIPTION OF THE DRAWINGS

The above and other aspects and features of the disclosure will become more apparent by describing in detail embodiments thereof with reference to the attached drawings, in which.

4

Figure 2:
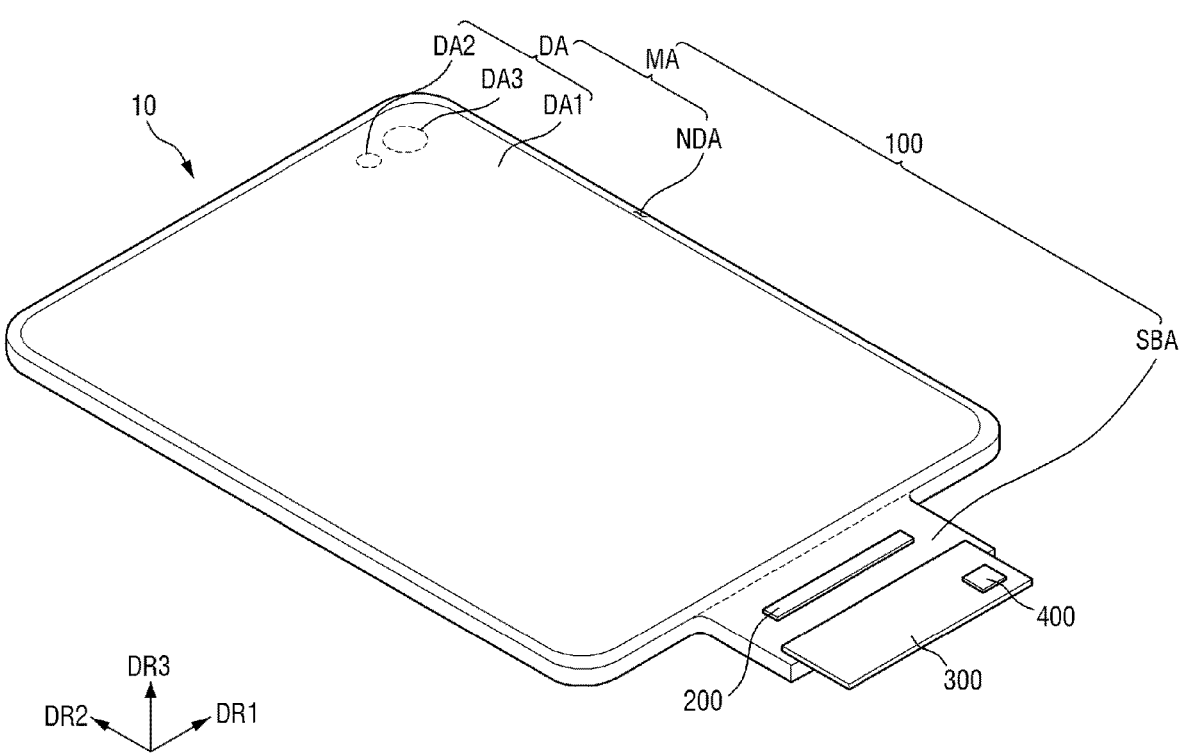
FIG. 2 is a schematic perspective view of a display device included in the electronic device according to an embodiment of the disclosure.
Figure 5:
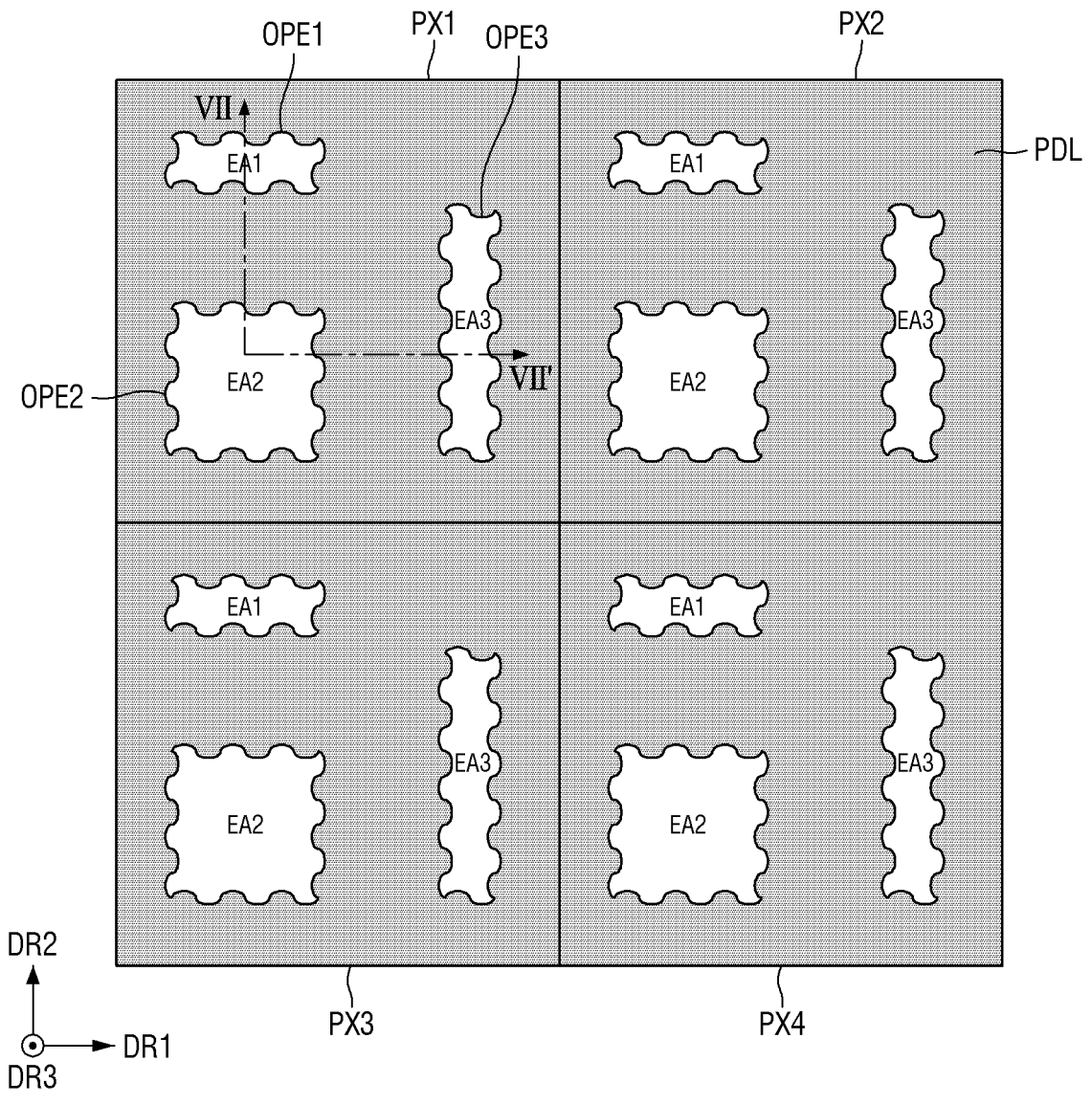
Figure 6:
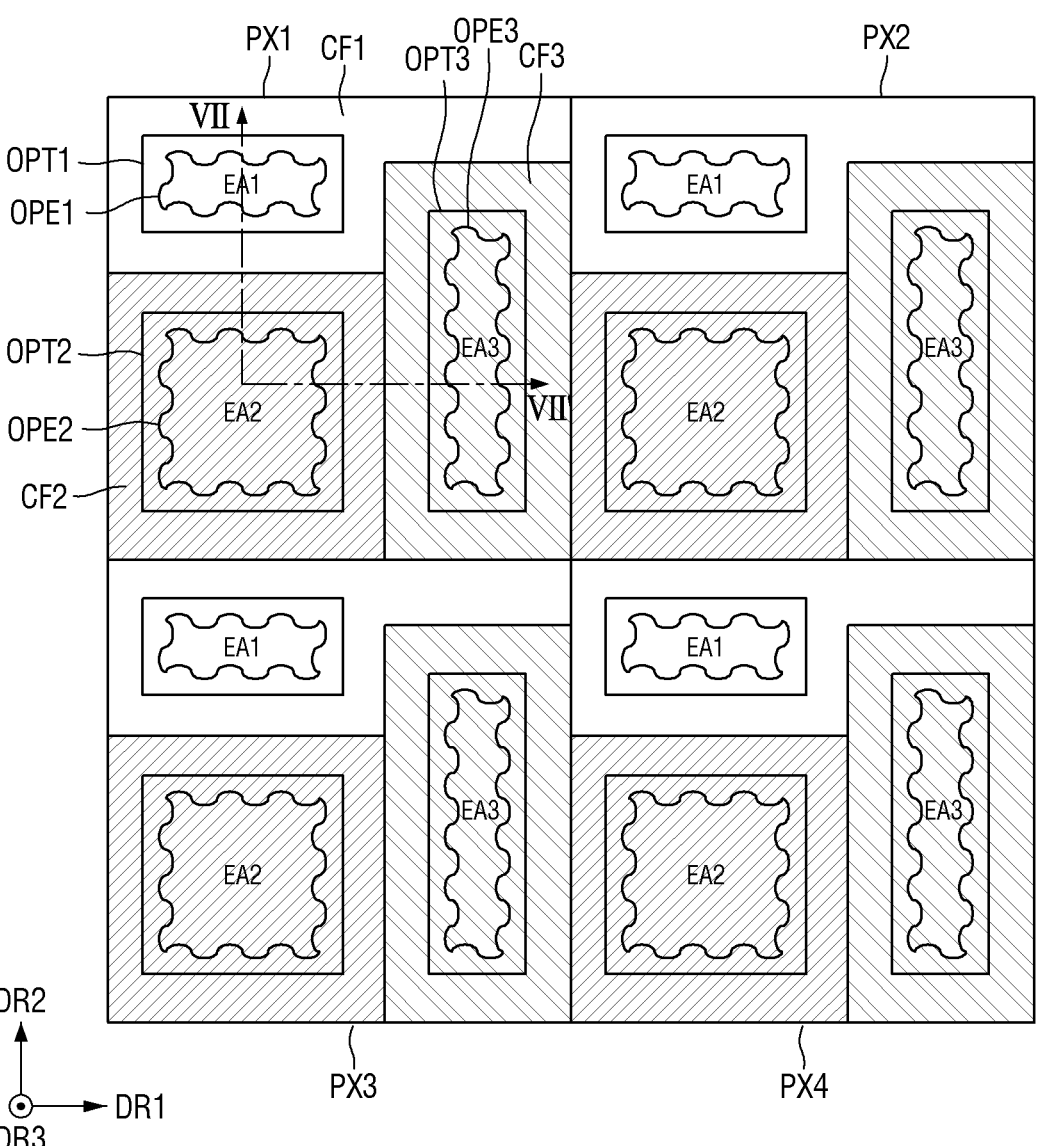
Figure 7:
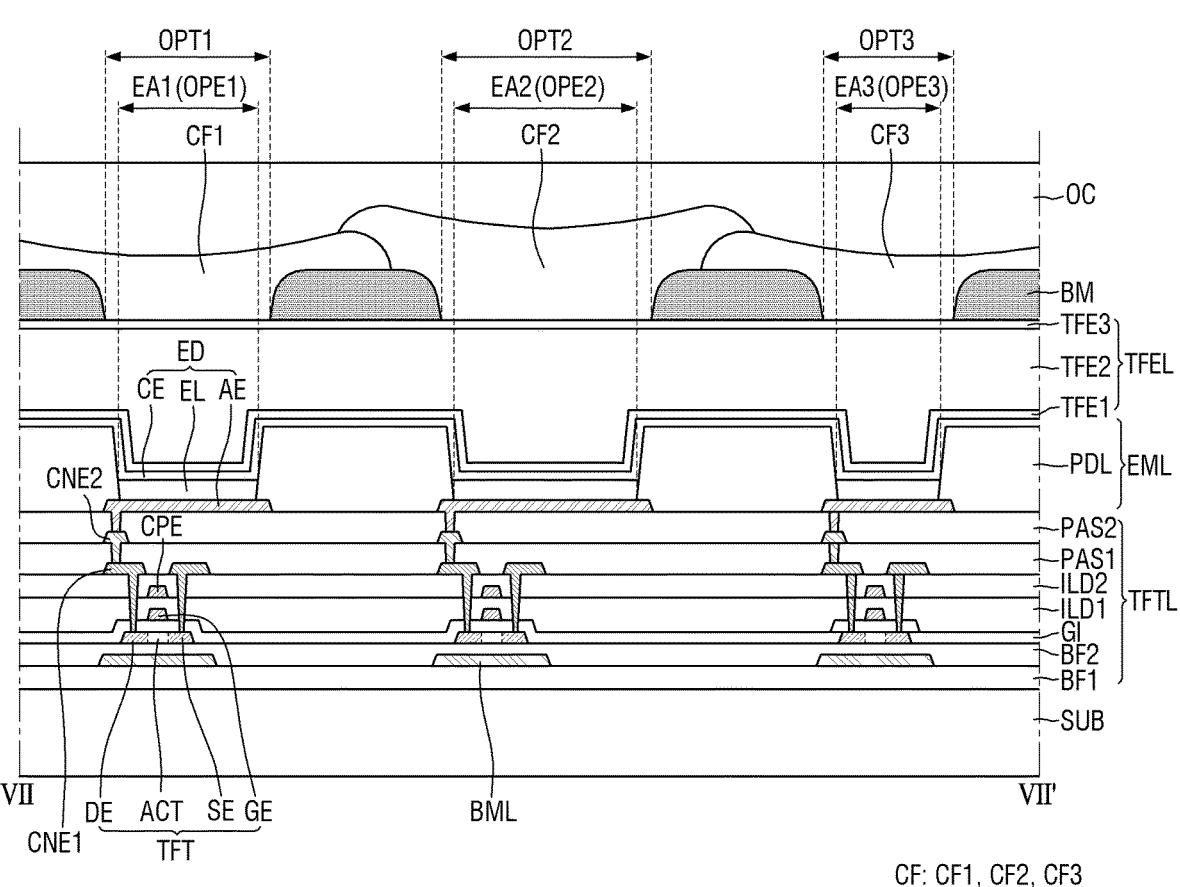
Figure 8:
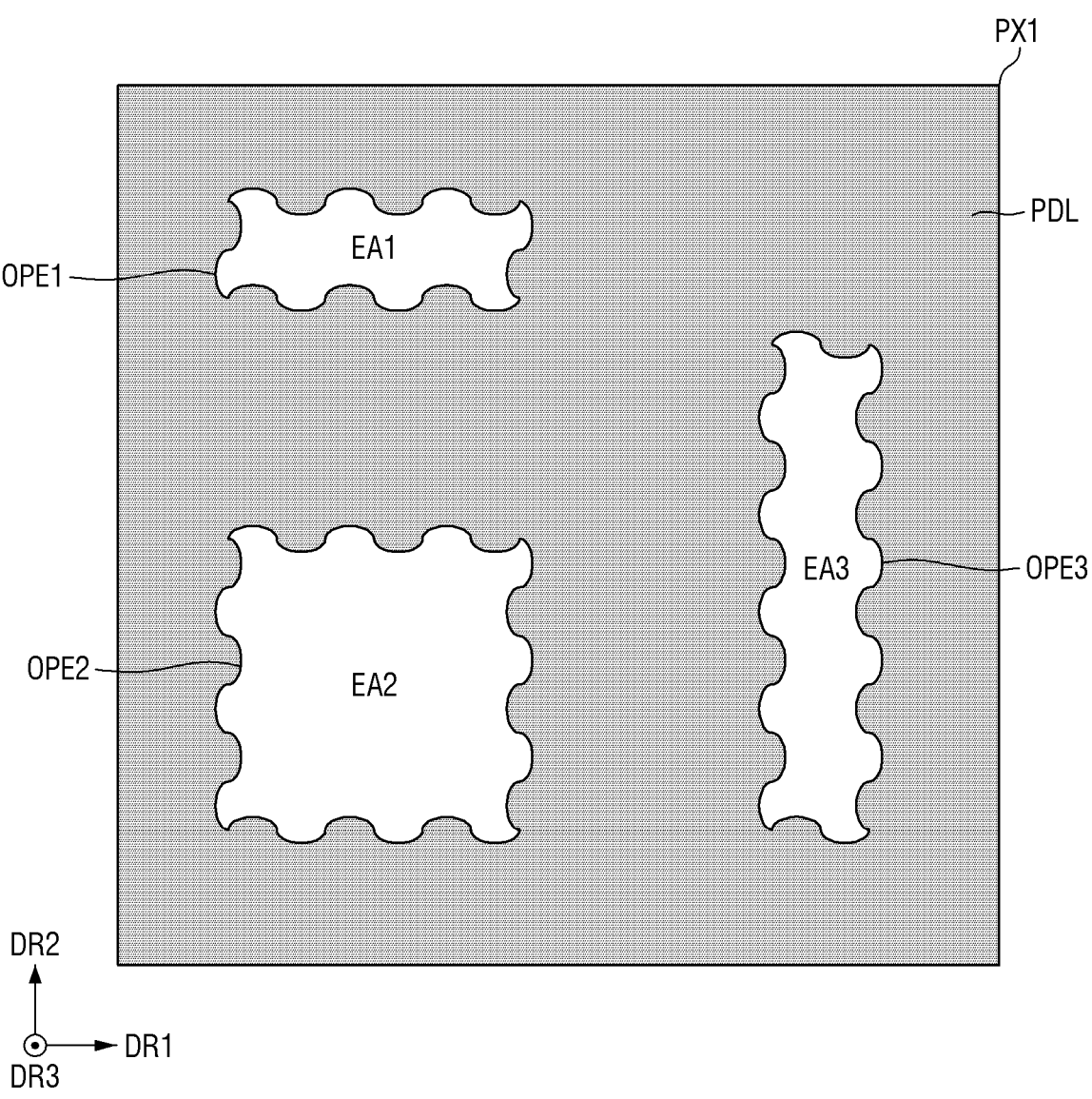
Figure 9:
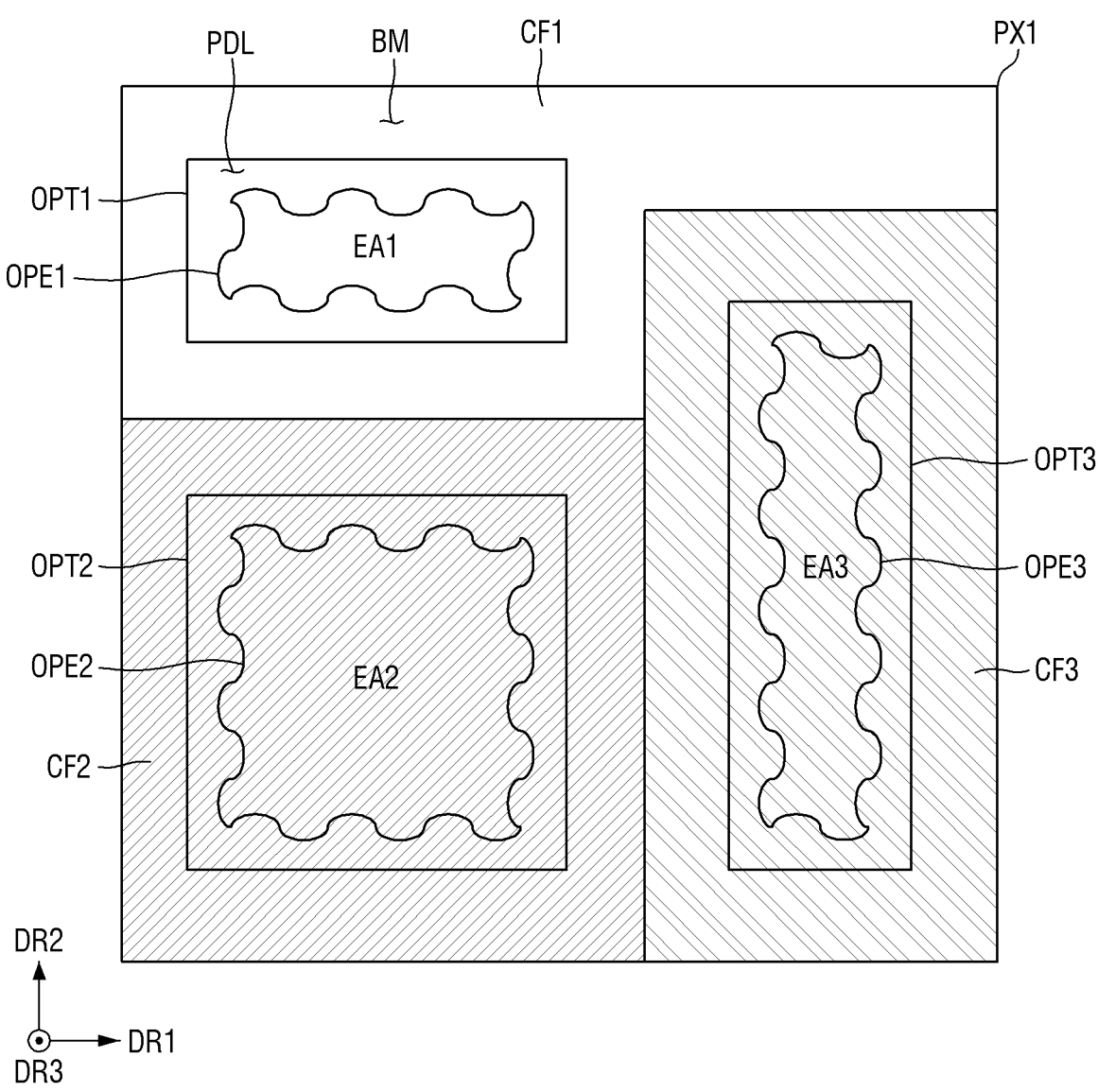
Figure 10:
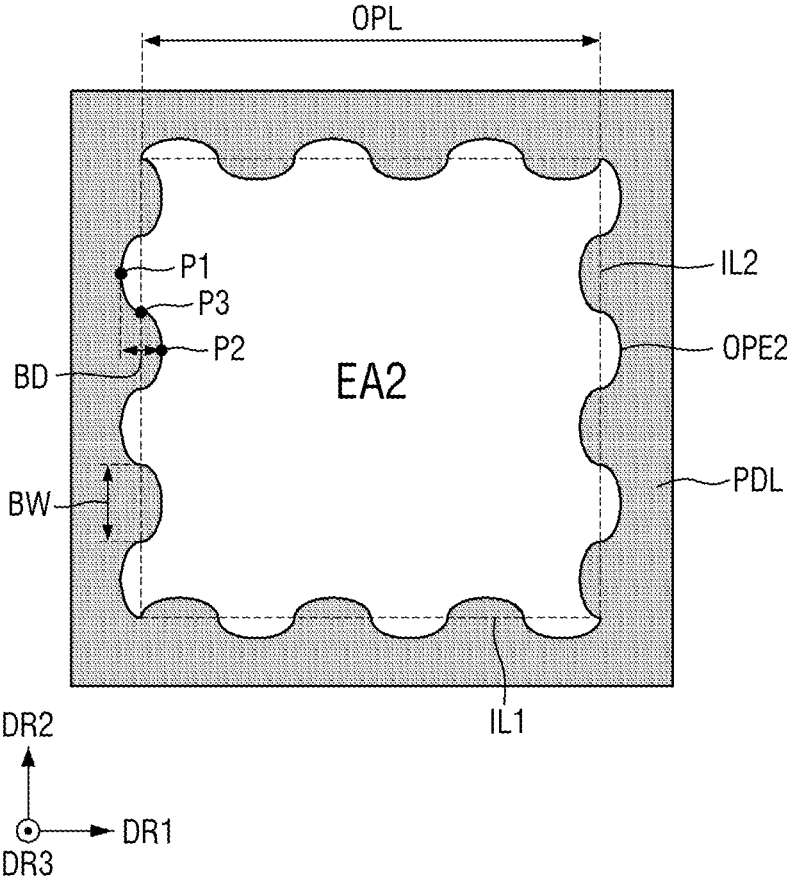
Figure 11:
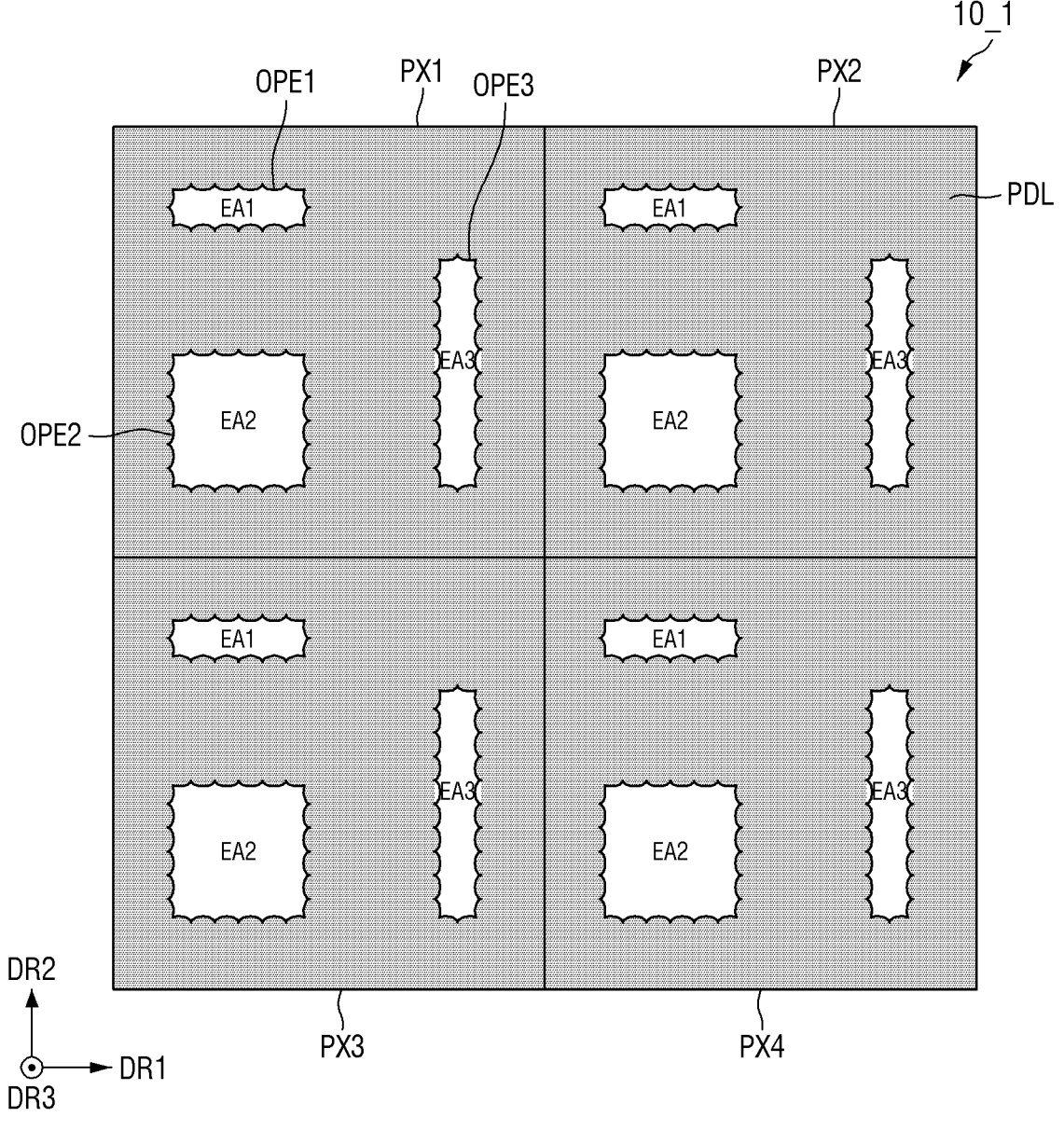
Figure 12:
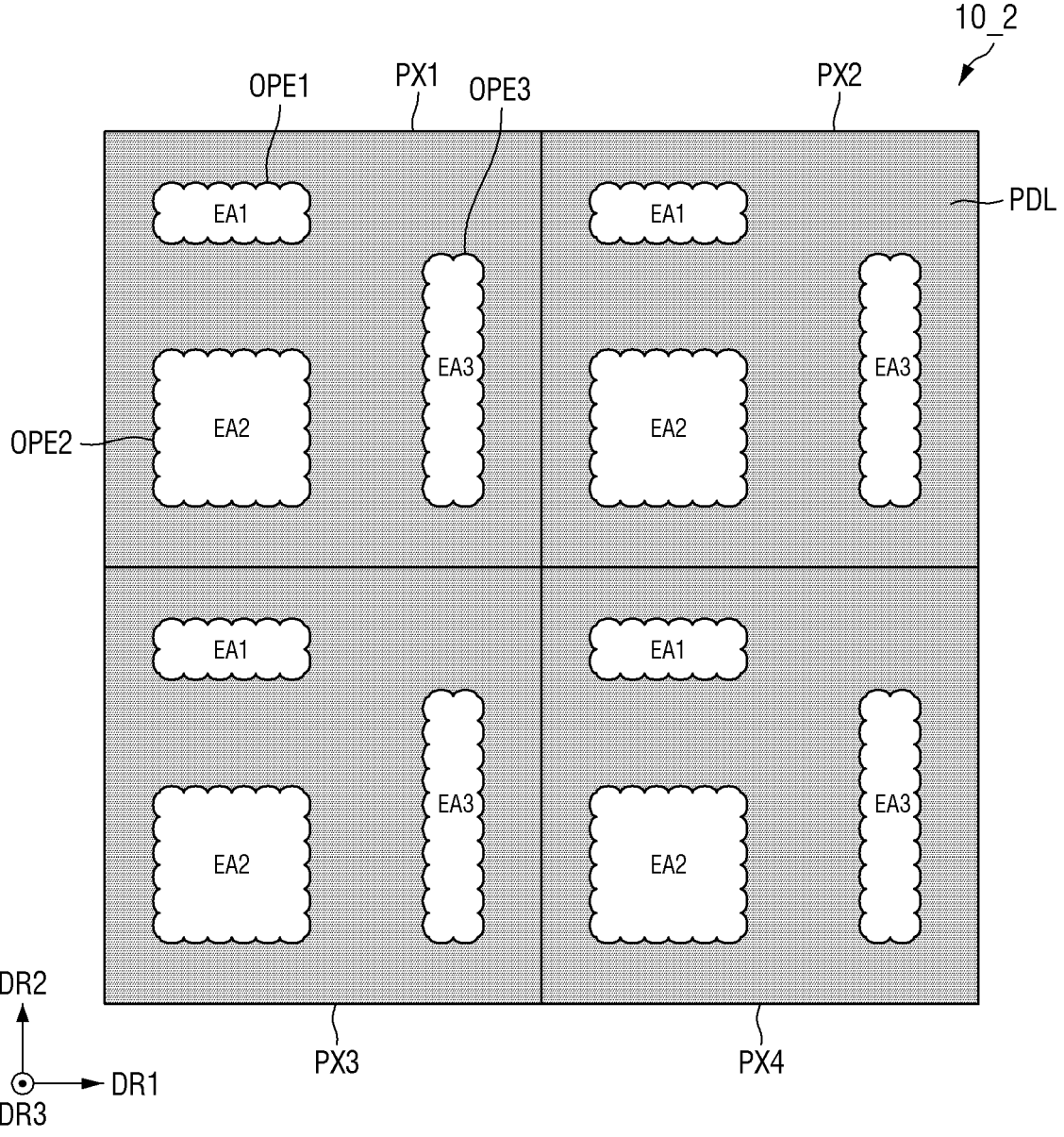
Figure 13:
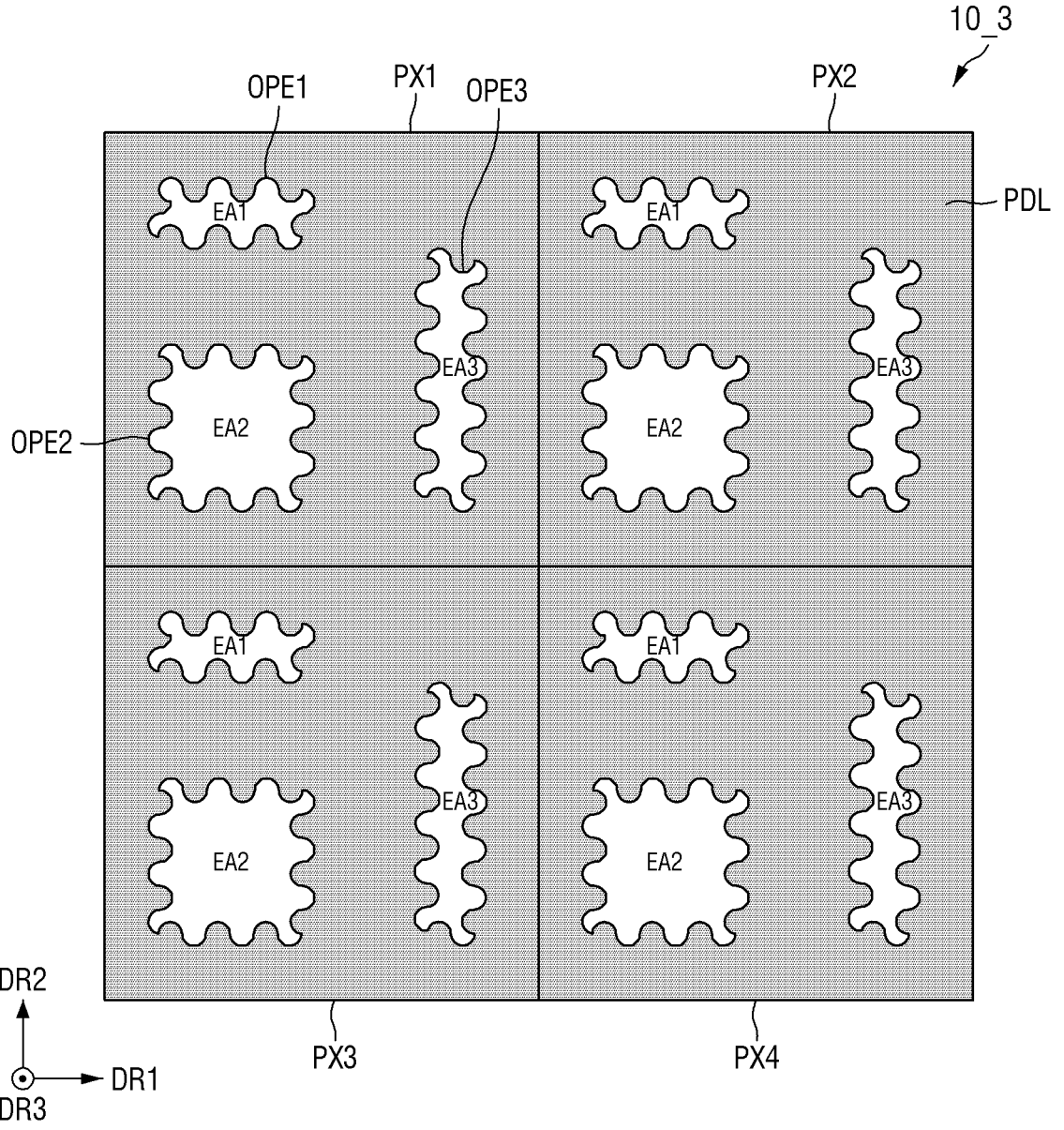
Figure 14:
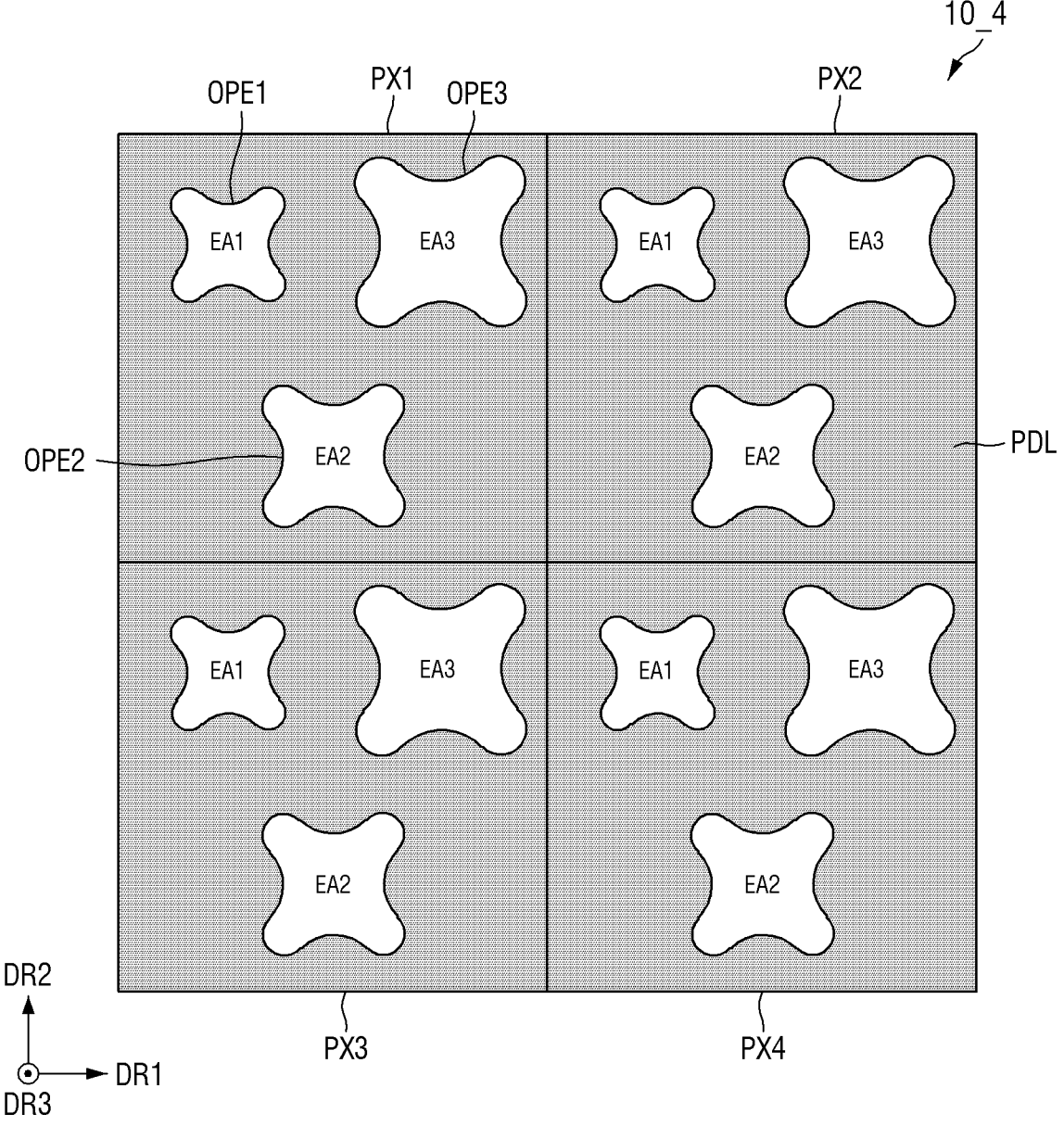
Figure 15:
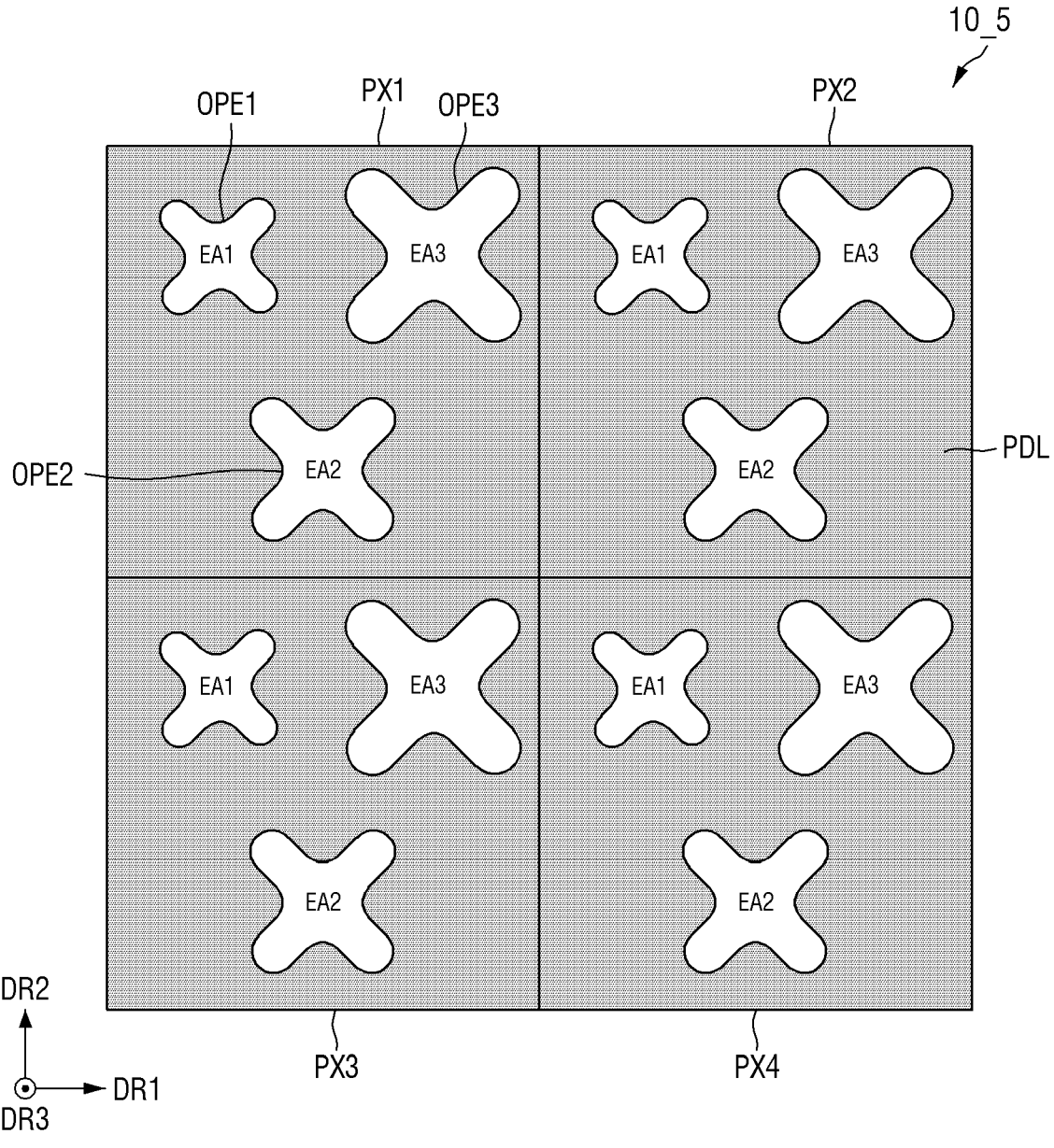
Figure 16:
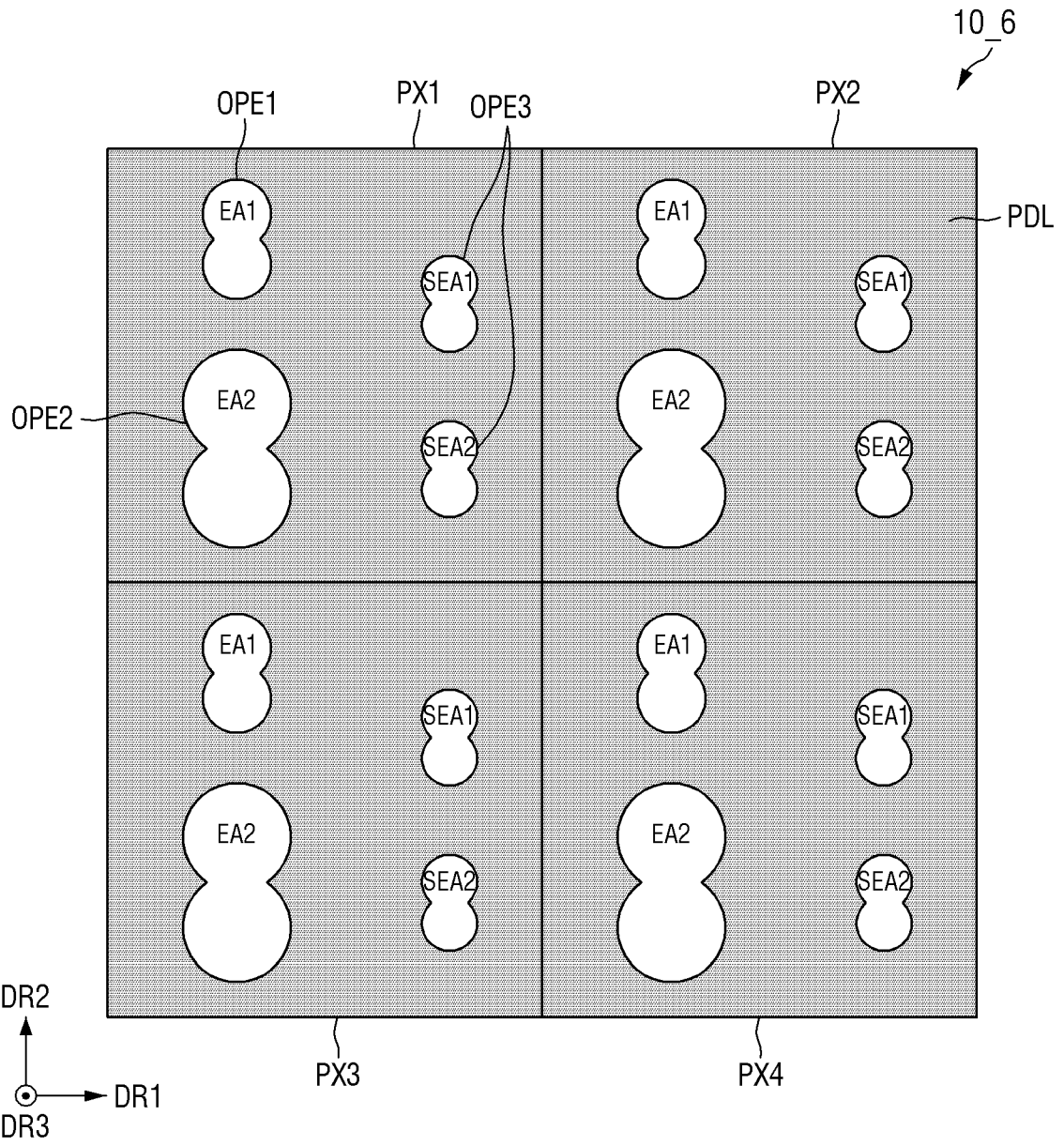
Figure 17:
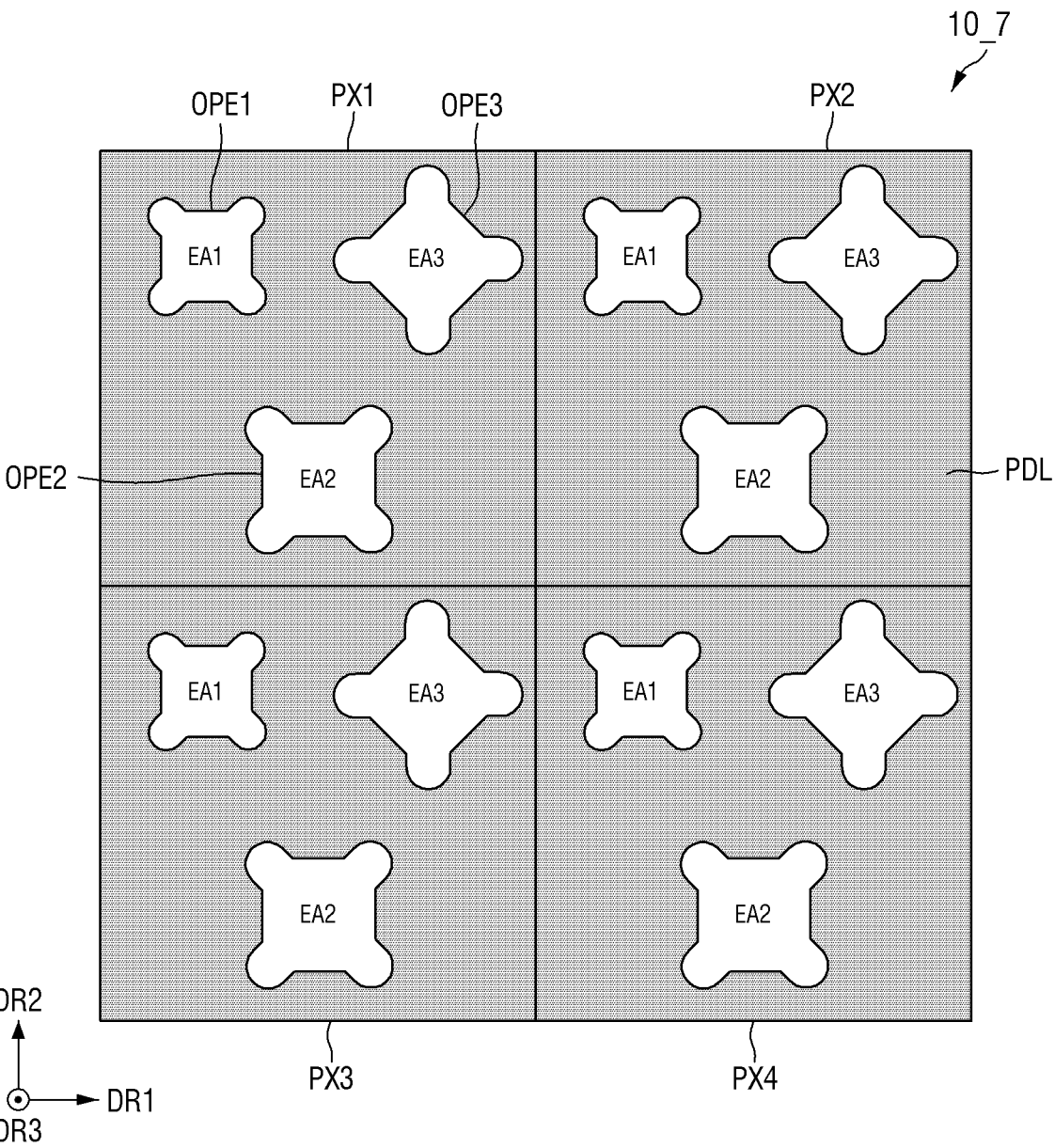
Figure 18:
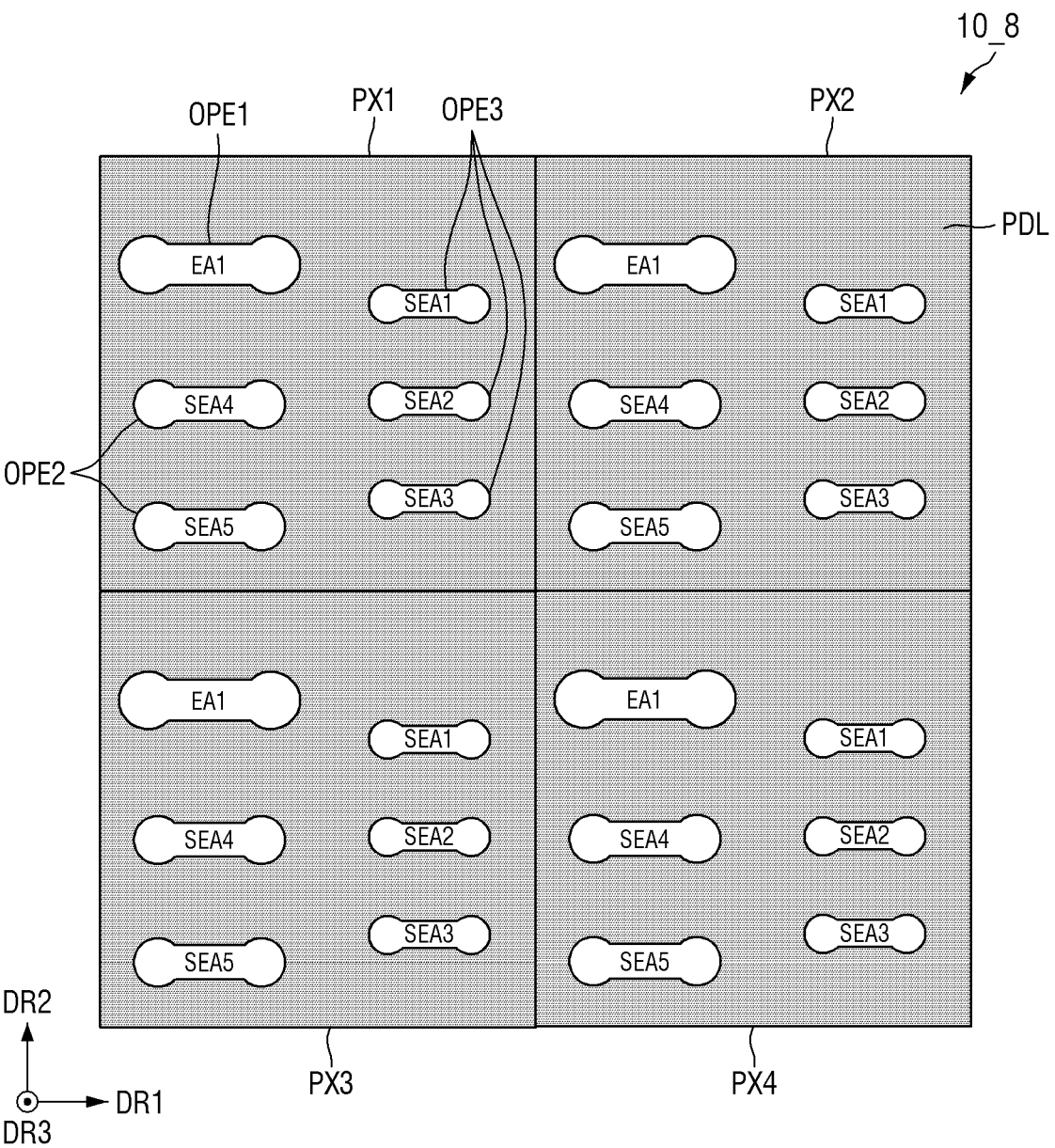
Figure 19:
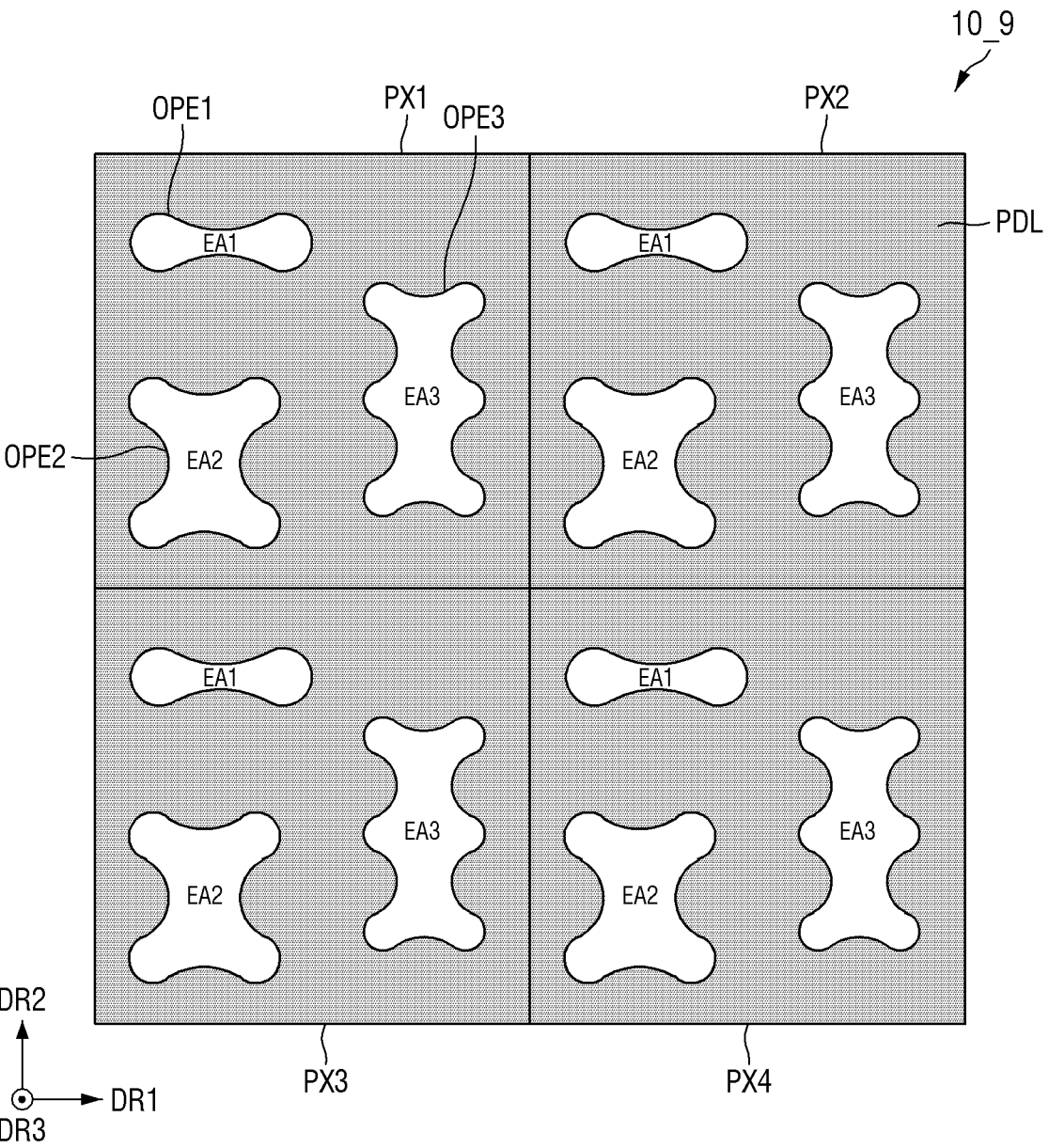
Figure 20:
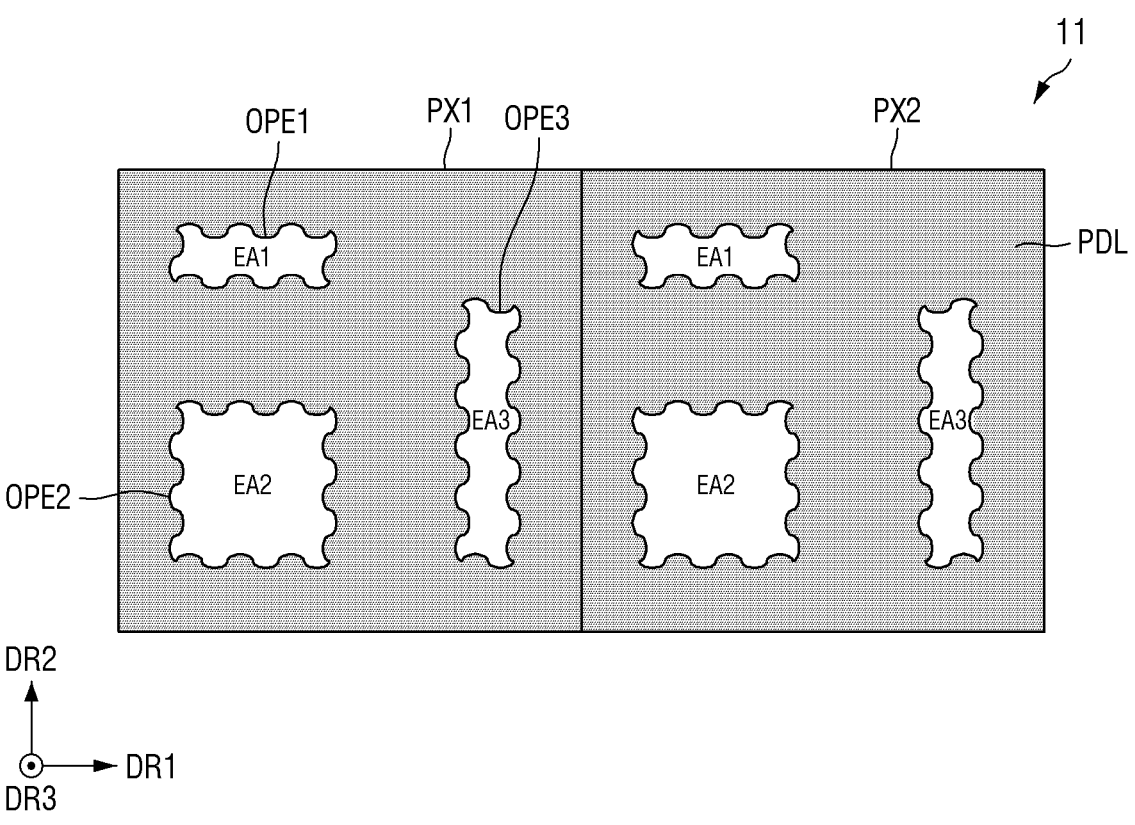
Figure 21:
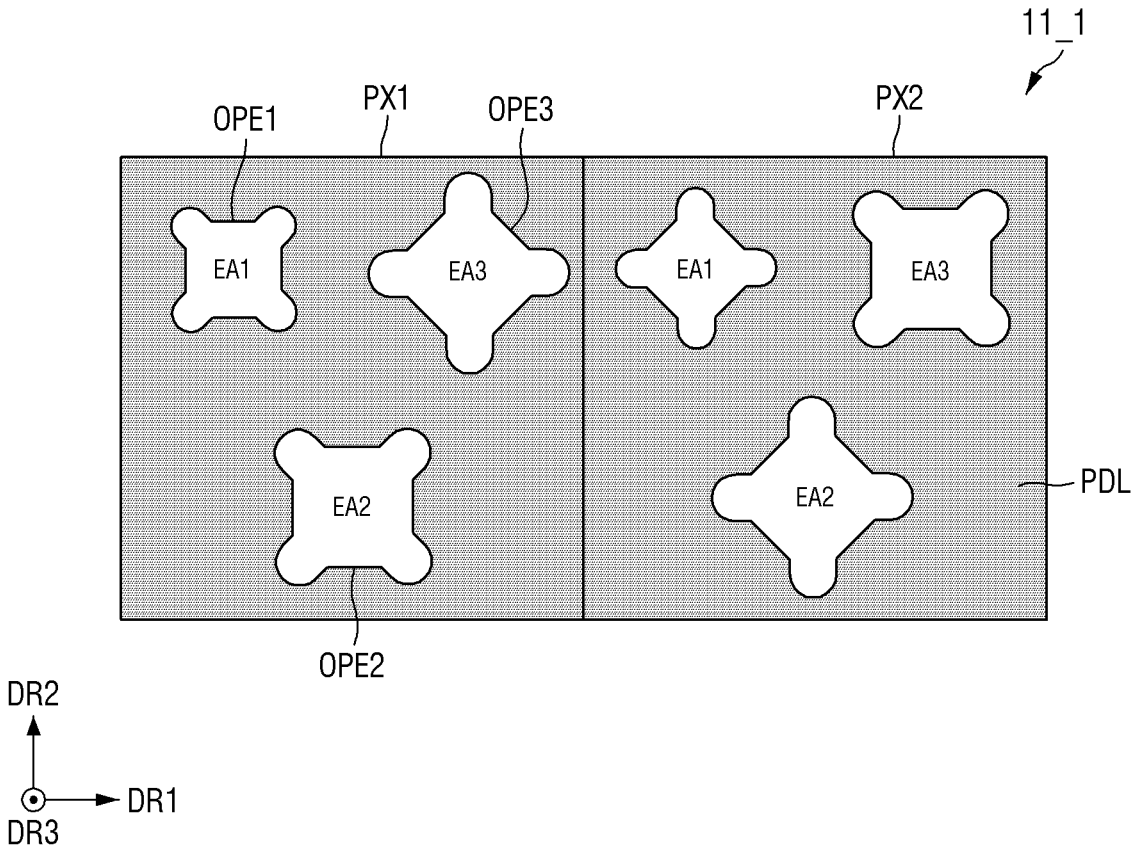
Figure 22:
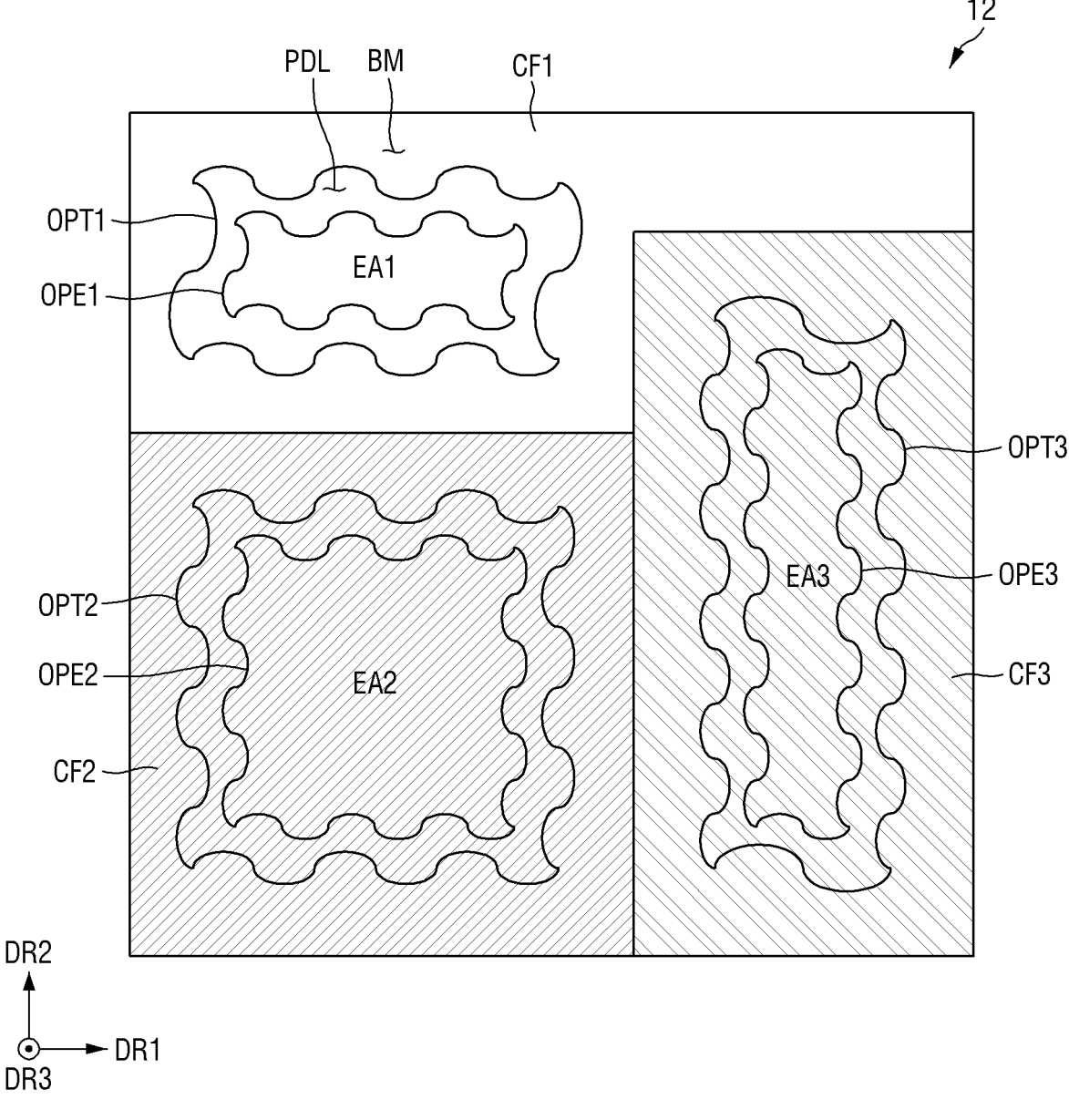
Figure 23:
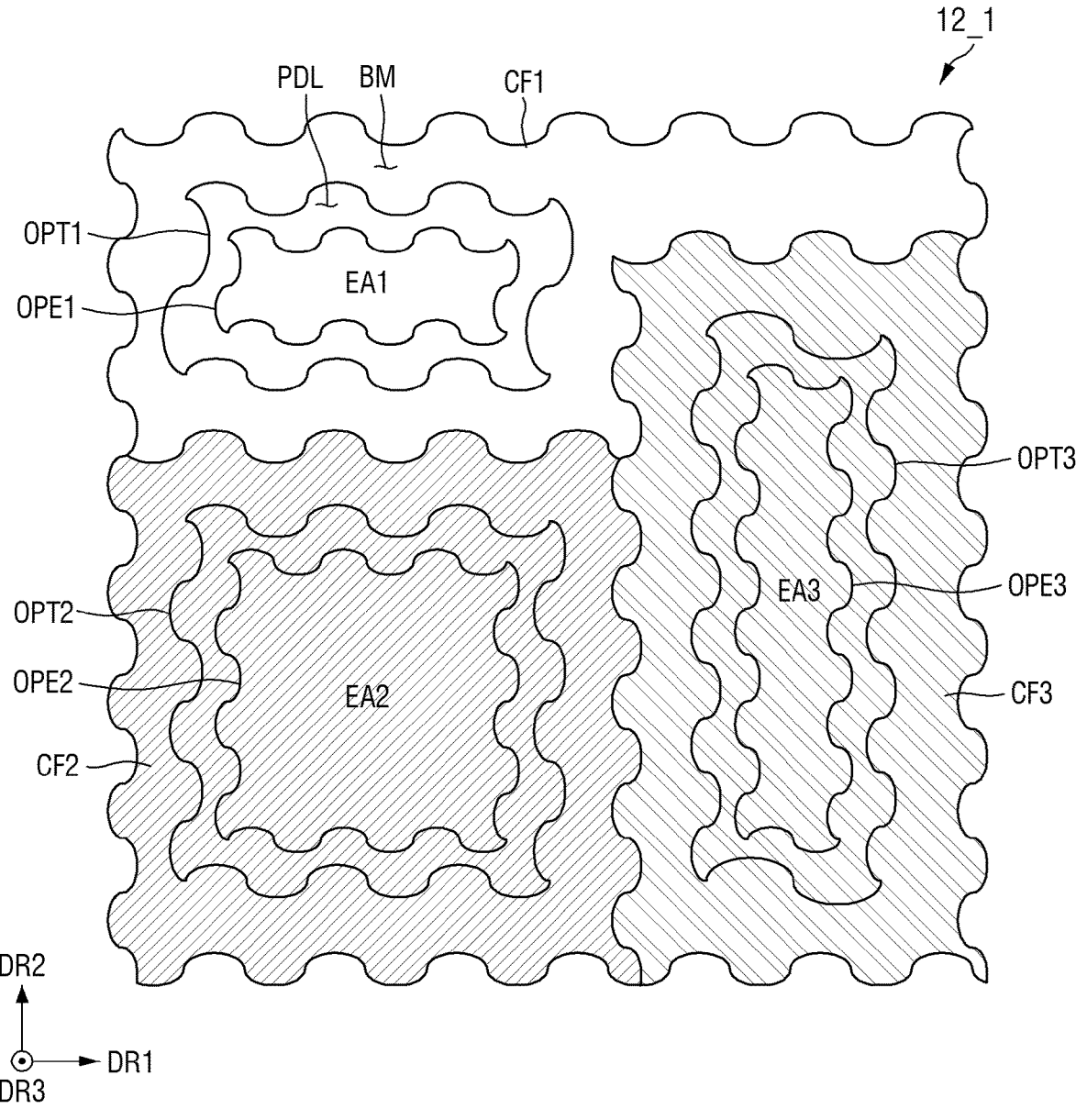
Figure 24:
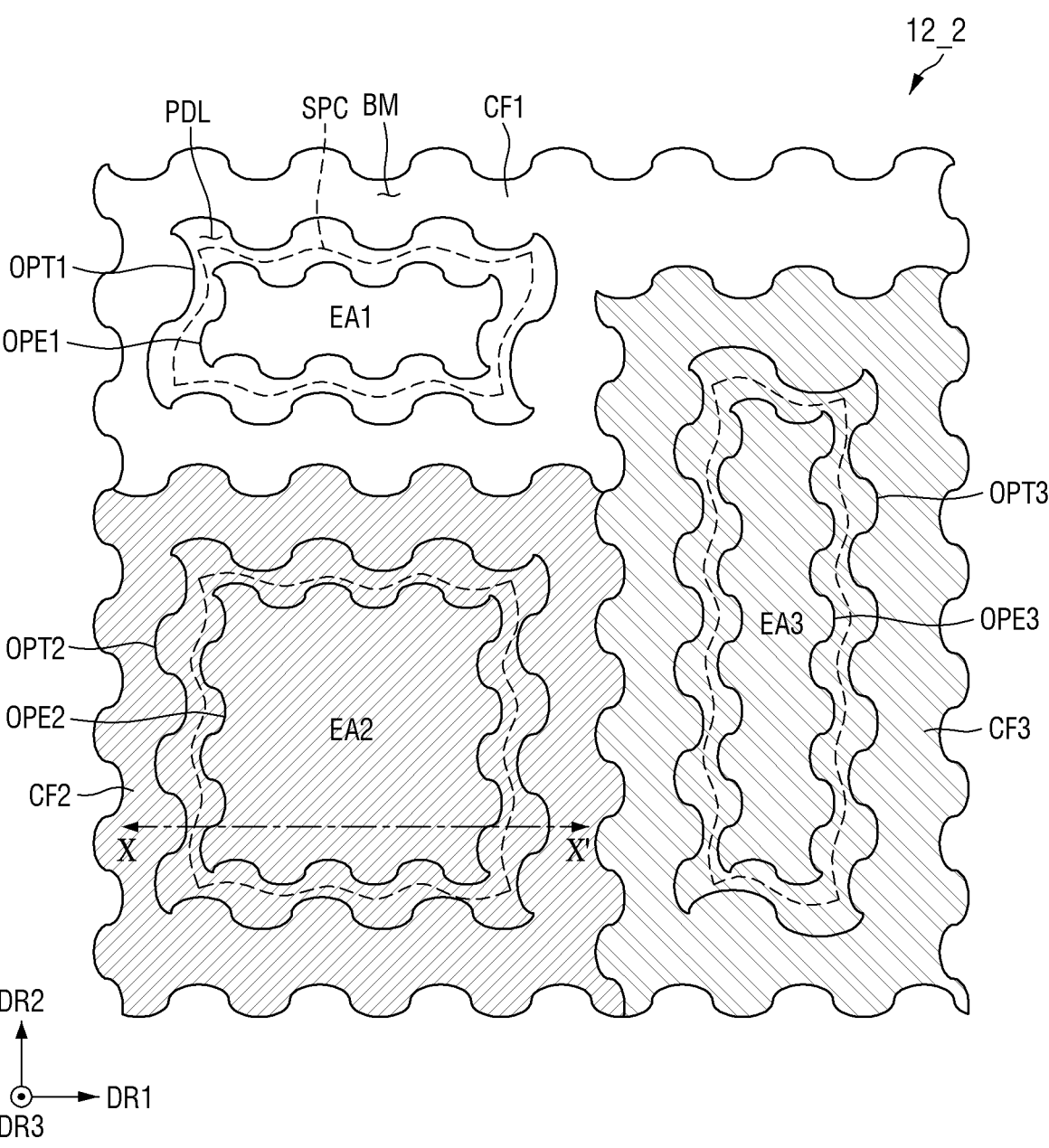
Figure 25:
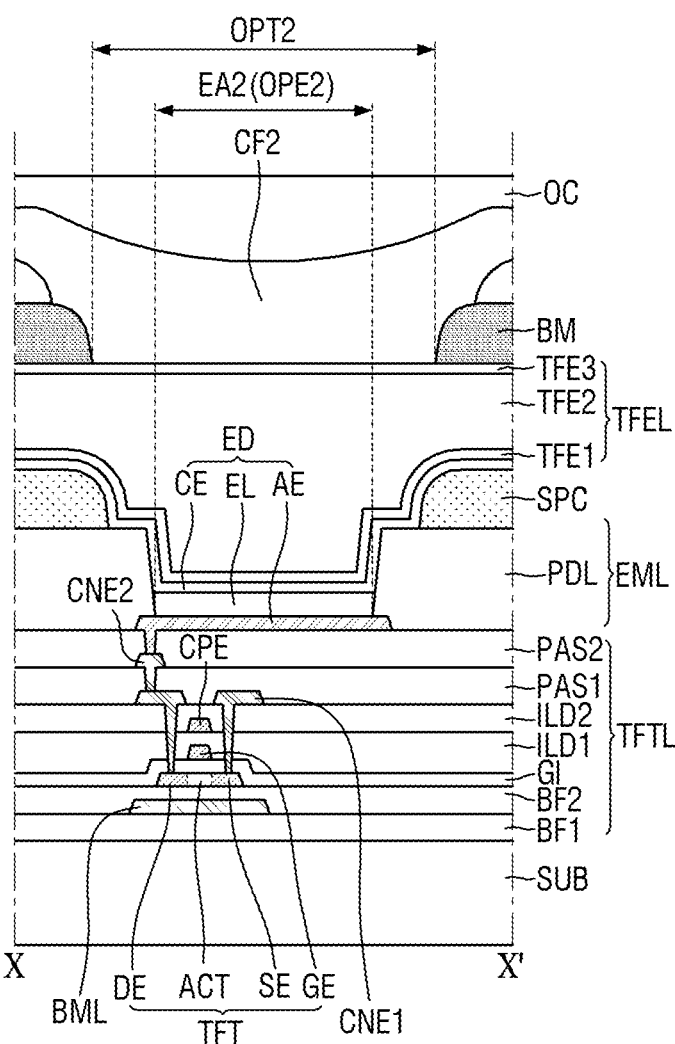

FIG. 5 is a schematic plan view illustrating the layout of emission areas in a display area of the display device of FIG. 2;

FIG. 6 is a schematic plan view illustrating the layout of color filters in the display area of the display device of FIG. 2;

FIG. 7 is a schematic cross-sectional view taken along line VII-VII' of FIG. 5;

FIG. 8 is a schematic plan view illustrating the layout of emission areas in a pixel of FIG. 5;

FIG. 9 is a schematic plan view illustrating the layout of color filters in a pixel of FIG. 6;

FIG. 10 is a schematic plan view illustrating an opening of the display device of FIG. 2;

FIGS. 11 through 13 are schematic plan views illustrating the layout of emission areas in display areas of display devices according to other embodiments of the disclosure;

FIGS. 14 and 15 are schematic plan views illustrating the layout of emission areas in display areas of display devices according to other embodiments of the disclosure;

FIG. 16 is a schematic plan view illustrating the layout of emission areas in a display area of a display device according to another embodiment of the disclosure;

FIGS. 17 through 19 are schematic plan views illustrating the layout of emission areas in display areas of display devices according to other embodiments of the disclosure;

FIG. 20 is a schematic plan view illustrating emission areas in two adjacent pixels of a display device according to another embodiment of the disclosure;

FIG. 21 is a schematic plan view illustrating emission areas in two adjacent pixels of a display device according to another embodiment of the disclosure;

FIGS. 22 through 24 are schematic plan views illustrating emission areas and color filters in pixels of display devices according to other embodiments of the disclosure; and FIG. 25 is a schematic cross-sectional view taken along line X-X' of FIG. 24.

DETAILED DESCRIPTION OF THE EMBODIMENTS

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well, unless the context clearly indicates otherwise. It will be understood that the terms "connected to" or "coupled to" may include a physical or electrical connection or coupling.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean any combination including "A, B, or A and B."

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or to "not overlap" another element, this may include that the elements are spaced apart from each other, offset from each other, or set aside from each other or any other suitable term as would be appreciated and understood by those of ordinary skill in the art.

"About" or "approximately" or "substantially" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
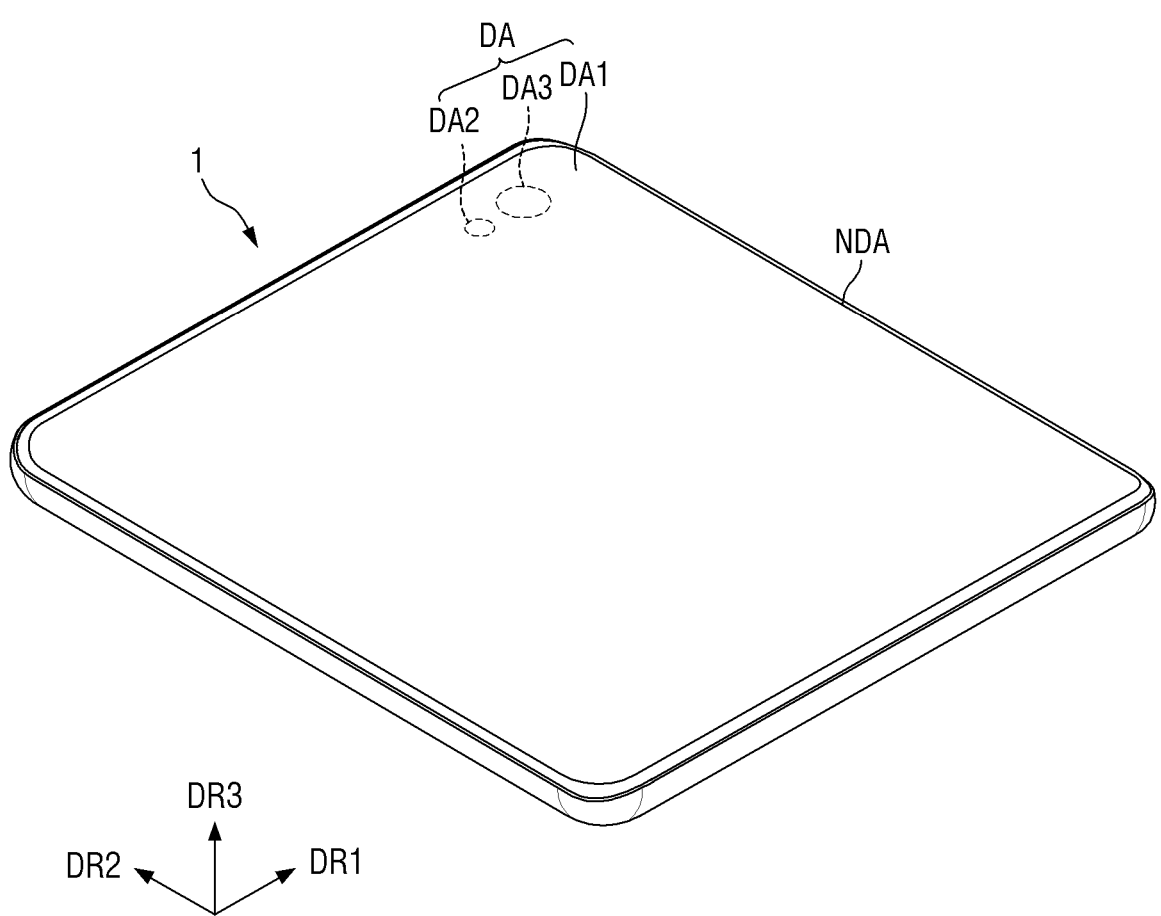
FIG. 1 is a schematic perspective view of an electronic device according to an embodiment of the disclosure.

FIG. 1 is a schematic perspective view of an electronic device according to an embodiment of the disclosure.

Referring to FIG. 1, an electronic device 1 may display a moving image or a still image. The electronic device 1 may refer to nearly all types of electronic devices providing a display screen. Examples of the electronic device 1 include a television (TV), a notebook computer, a monitor, an electronic billboard, an Internet-of-Things (IoT) device, a mobile phone, a smartphone, a tablet personal computer (PC), an electronic watch, a smartwatch, a watchphone, a head-mounted display (HMD), a mobile communication terminal, an electronic notepad, an electronic book reader, a portable multimedia player (PMP), a navigation device, a gaming console, a digital camera, and a camcorder.

The electronic device 1 may include a display device 10 (of FIG. 2). Examples of the display device 10 include an inorganic light-emitting diode display device, an organic light-emitting diode (OLED) display device, a quantum-dot light-emitting display device, a plasma display device, and a field emission display (FED) device. The display device 10 will hereinafter be described as being, for example, an OLED display device, but the disclosure is not limited thereto. Obviously, the display device 10 may also be embodied as various other display devices.

The shape of the electronic device 1 may vary. For example, the electronic device 1 may have a rectangular shape that extends longer horizontally than vertically, a rectangular shape that extends longer vertically than horizontally, a square shape, a rectangular shape with rounded corners, another polygonal shape, and/or a circular shape. A display area DA of the electronic device 1 may generally have a similar shape to the electronic device 1. FIG. 1 illustrates that the electronic device 1 has a rectangular shape that extends longer in a first direction DR1 than in a second direction DR2.

The electronic device 1 may include a display area DA and a non-display area NDA. The display area DA may be an area where an image can be displayed, and the non-display area NDA may be an area where an image is not displayed. The display area DA may also be referred to as an active area, and the non-display area NDA may also be referred to as an inactive area. The display area DA may generally account for the middle of the electronic device 1.

The display area DA may include first, second, and third display areas DA1, DA2, and DA3. The second and third display areas DA2 and DA3 may be component areas where components for adding various functions are disposed.

FIG. 2 is a schematic perspective view of a display device included in the electronic device of FIG. 1.

Referring to FIG. 2, the electronic device 1 may include a display device 10. The display device 10 may provide a display screen for the electronic device 1. The display device 10 may have a similar shape to the electronic device 1. In the example of FIG. 2, the display device 10 may have a rectangular shape having short sides extending in the first direction DR1 and long sides extending in the second direction DR1. The corners where the short sides and the long sides of the display device 10 meet may be rounded to have a predetermined or given curvature or may be right-angled. The shape of the display device 10 is not particularly limited, and the display device 10 may be formed in various other shapes such as another polygonal shape, a circular shape, or an elliptical shape.

The display device 10 may include a display panel 100, a display driving unit 200, a circuit board 300, and a touch driving unit 400.

The display panel 100 may include a main area MA and a subarea SBA.

The main area MA may include a display area DA, which includes pixels for displaying an image, and a non-display area NDA, which is disposed around the display area DA. The display area DA may include the first, second, and third display areas DA1, DA2, and DA3. The display area DA may emit light through multiple emission areas or openings. For example, the display panel 100 may include pixel circuits including switching elements, a pixel-defining film defining the emission areas or the openings, and self-light-emitting elements.

For example, the self-light-emitting elements may include organic light-emitting diodes (OLEDs), quantum-dot light-emitting diodes (LEDs) including a quantum-dot light-emitting layer, inorganic LEDs including an inorganic semiconductor, and/or microLEDs, but the disclosure is not limited thereto.

The non-display area NDA may be on the outside of the display area DA. The non-display area NDA may be defined as an edge part of the main area MA. The non-display area NDA may include a gate driving unit (not illustrated)

providing gate signals to gate lines and fan-out lines (not illustrated) connecting the display driving unit 200 and the display area DA.

The subarea SBA may be an area extending from one side of the main area MA. The subarea SBA may include a flexible material that is bendable, foldable, or rollable. For example, in a case where the subarea SBA is bendable, the subarea SBA may be bent to overlap the main area MA in a thickness direction (or a third direction DR3). The subarea SBA may include the display driving unit 200 and a pad unit, which is connected to the circuit board 300. The subarea SBA may not be provided, and the display driving unit 200 and the pad unit may be disposed in the non-display area NDA.

The display driving unit 200 may output signals and voltages for driving the display panel 100. The display driving unit 200 may provide data voltages to data lines. The display driving unit 200 may provide power supply voltages to power supply lines and may provide gate control signals to the gate driving unit. The display driving unit 200 may be formed as an integrated circuit (IC) and may be mounted on the display panel 100 in a chip-on-glass (COG) or chip-on-plastic (COP) manner or via ultrasonic bonding. For example, the display driving unit 200 may be disposed in the subarea SBA and may overlap the main area MA in the thickness direction in case that the subarea SBA is bent. In another example, the display driving unit 200 may be mounted on the circuit board 300.

The circuit board 300 may be attached to the pad unit of the display panel 100 via an anisotropic conductive film (ACF). Lead lines of the circuit board 300 may be electrically connected to the pad unit of the display panel 100. The circuit board 300 may be a printed circuit board (PCB), a flexible PCB (FPCB), or a flexible film such as a chip-on-film (COF).

The touch driving unit 400 may be mounted on the circuit board 300. The touch driving unit 400 may be electrically connected to a touch sensing unit included in the electronic device 1. The touch driving unit 400 may provide a touch driving signal to multiple touch electrodes of the touch sensing unit and may sense capacitance variations between the touch electrodes. For example, the touch driving signal may be a pulse signal having a predetermined or given frequency. The touch driving unit 400 may calculate the presence and coordinates of input based on the capacitance variations between the touch electrodes. The touch driving unit 400 may be formed as an integrated circuit (IC).

Figure 3:
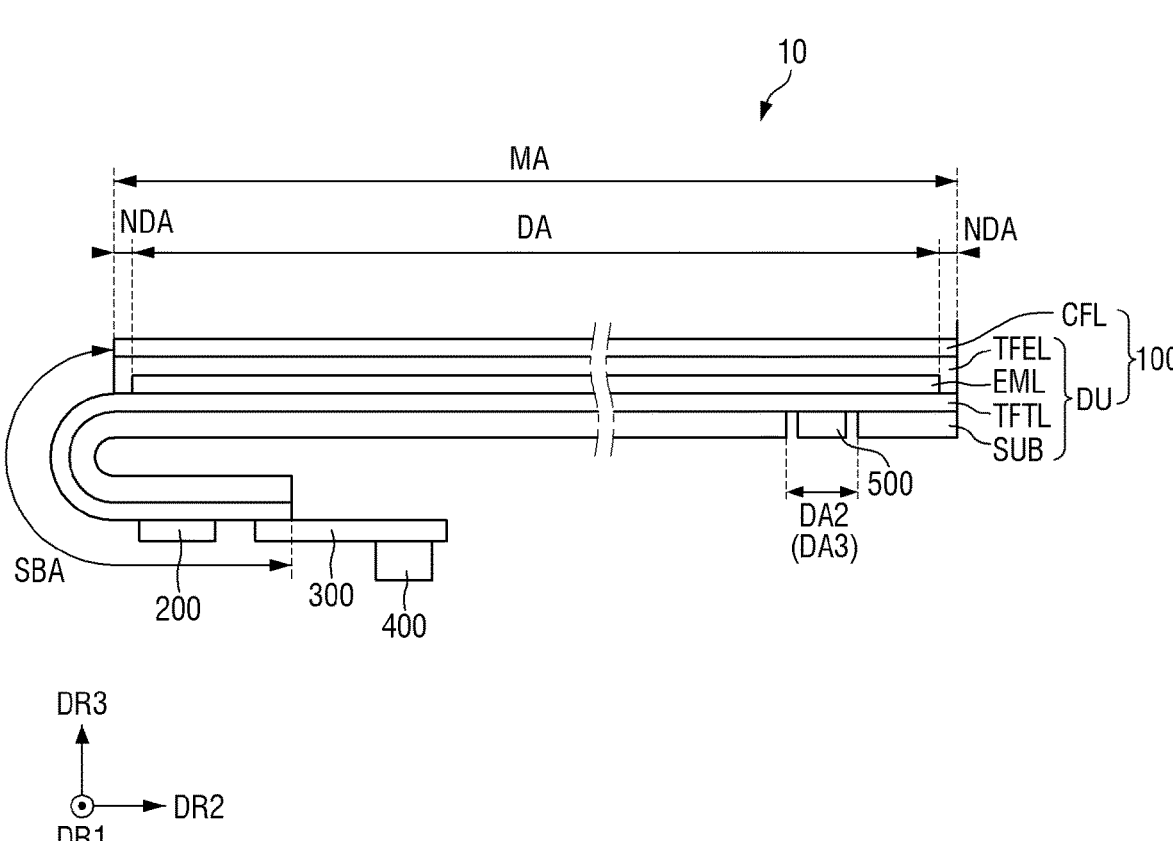
FIG. 3 is a schematic cross-sectional view of the display device of FIG. 2.

FIG. 3 is a schematic cross-sectional view of the display device of FIG. 2.

Referring to FIG. 3, the display panel 100 may include a display layer DU and a color filter layer CFL. The display layer DU may include a substrate SUB, a thin-film transistor (TFT) layer TFTL, a light-emitting element layer EML, and an encapsulation layer TFEL.

The substrate SUB may be a base substrate or a base member. The substrate SUB may be a flexible substrate that is bendable, foldable, and/or rollable. For example, the substrate SUB may include a polymer resin such as polyimide (PI), but the disclosure is not limited thereto. In another example, the substrate SUB may include a glass material or a metal material.

The TFT layer TFTL may be disposed on the substrate SUB. The TFT layer TFTL may include multiple TFTs that form the pixel circuitry of pixels. The TFT layer TFTL may further include gate lines, data lines, power lines, gate control lines, and fan-out lines connecting the display driving unit 200 and the data lines, and lead lines connecting the display driving unit 200 and the pad unit. The TFTs may include semiconductor regions, source electrodes, drain electrodes, and gate electrodes. For example, in a case where the gate driving unit is formed on one side of the non-display area NDA of the display panel 100, the gate driving unit may include TFTs.

The TFT layer TFTL may be disposed in the display area DA, the non-display area NDA, and the subarea SBA. The TFTs, the gate lines, the data lines, and the power lines of the TFT layer TFTL may be disposed in the display area DA. The gate control lines and the fan-out lines of the TFT layer TFTL may be disposed in the non-display area NDA. The lead lines of the TFT layer TFTL may be disposed in the subarea SBA.

The light-emitting element layer EML may be disposed on the TFT layer TFTL. The light-emitting element layer EML may include light-emitting elements, which include first electrodes, second electrodes, light-emitting layers and emit light, and a pixel-defining film, which defines the pixels. The light-emitting elements of the light-emitting element layer EML may be disposed in the display area DA.

The light-emitting layers may be organic light-emitting layers including an organic material. The light-emitting layers may include hole transport layers, organic light-emitting layers, and electron transport layers. As the first electrodes receive a voltage through the TFTs of the TFT layer TFTL and the second electrodes receive a cathode voltage, holes and electrons may move to the organic emission layers through the hole transport layers and the electron transport layers, respectively, and may combine together in the organic light-emitting layers to emit light.

In another embodiment, the light-emitting elements may be quantum-dot light-emitting diodes (LEDs) including quantum-dot light-emitting layers, inorganic LEDs including an inorganic semiconductor, or micro-LEDs.

The encapsulation layer TFEL may cover the top surface and sides of the light-emitting element layer EML and may protect the light-emitting element layer EML. The encapsulation layer TFEL may include at least one inorganic film and at least one organic film for encapsulating the light-emitting element layer EML.

The color filter layer CFL may be disposed on the encapsulation layer TFEL. The color filter layer CFL may include multiple color filters CF (FIG. 7), which correspond to multiple emission areas. Each of the color filters may selectively transmit light of a particular wavelength therethrough and may block or absorb light of other wavelengths. The color filter layer CFL may absorb some light introduced into the display device 10 from the outside and may thus reduce reflected light of external light. Accordingly, the color filter layer CFL can prevent any color distortions that may be caused by the reflection of external light.

As the color filter layer CFL may be disposed directly on the encapsulation layer TFEL, the display device 10 may not need a separate substrate for the color filter layer CFL. Accordingly, the thickness of the display device 10 may be relatively small.

In some embodiments, the display device 10 may further include an optical device 500. The optical device 500 may be disposed in the second or third display area DA2 or DA3. The optical device 500 may emit or receive infrared light, ultraviolet light, or visible light. For example, the optical device 500 may be an optical sensor capable of sensing light incident upon the display device 10, such as a proximity sensor, a light sensor, a camera sensor, and/or an image sensor.

Figure 4:
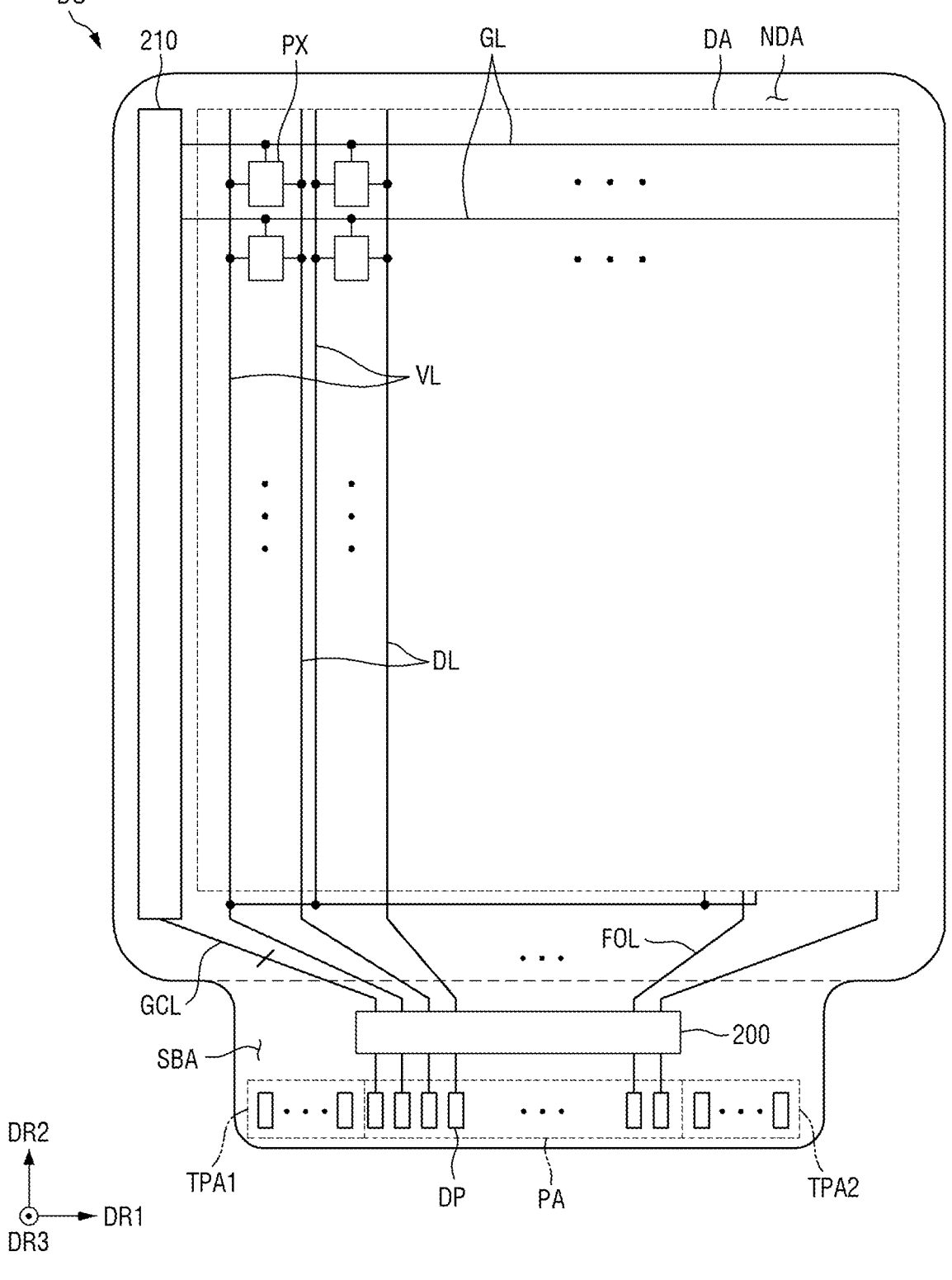
FIG. 4 is a schematic plan view of a display layer of the display device of FIG. 2.

FIG. 4 is a schematic plan view of the display layer of the display device of FIG. 2.

Referring to FIG. 4, the display layer DU may include the display area DA and the non-display area NDA.

The display area DA may be disposed in the middle of the display panel 100. Pixels PX, gate lines GL, data lines DL, and power supply lines VL may be disposed in the display area DA. The pixels PX may be defined as minimal units for emitting light.

The gate lines GL may provide gate signals received from the gate driving unit 210 to the pixels PX. The gate lines GL may extend in the first direction DR1 and may be spaced apart from one another in the second direction DR2, which intersects the first direction DR1.

The data lines DL may provide data voltages received from the display driving unit 200 to the pixels PX. The data lines DL may extend in the second direction DR2 and may be spaced apart from one another in the first direction DR1.

The power supply lines VL may provide the power supply voltages received from the display driving unit 200 to the pixels PX. Here, the power supply voltages include a driving voltage, an initialization voltage, a reference voltage, and/or a low-potential voltage. The power supply lines VL may extend in the second direction DR2 and may be spaced apart from one another in the first direction DR1.

The non-display area NDA may surround the display area DA. The gate driving unit 210, fan-out lines FOL, and gate control lines GCL may be disposed in the non-display area NDA. The gate driving unit 210 may generate gate signals based on the gate control signals and may sequentially provide the gate signals to the gate lines GL in a predefined order.

The fan-out lines FOL may extend from the display driving unit 200 to the display area DA. The fan-out lines FOL may provide data voltages received from the display driving unit 200 to the data lines DL.

The gate control lines GCL may extend from the display driving unit 200 to the gate driving unit 210. The gate control lines GCL may provide gate control signals received from the display driving unit 200 to the gate driving unit 210.

The subarea SBA may include the display driving unit 200, a pad area PA, and first and second touch areas TPA1 and TPA2.

The display driving unit 200 may output signals and voltages for driving the display panel 100 to the fan-out lines FOL. The display driving unit 200 may provide data voltages to the data lines DL through the fan-out lines FOL. The data voltages may be provided to the pixels PX and may control the luminance of the pixels PX. The display driving unit 200 may provide gate control signals to the gate driving unit 210 through the gate control lines GCL.

The pad area PA, the first touch pad area TPA1, and the second touch pad area TPA2 may be disposed on an edge of the subarea SBA. The pad area PA, the first touch pad area TPA1, and the second touch pad area TPA2 may be electrically connected to the circuit board 300 via an anisotropic conductive film (ACF) or a self-assembly anisotropic conductive paste (SAP).

The pad area PA may include multiple display pads DP. The display pads DP may be connected to a graphics system via the circuit board 300. The display pads DP may be connected to the circuit board 300 and may thus receive digital video data and provide the digital video data to the display driving unit 200.

FIG. 5 is a schematic plan view illustrating the layout of the emission areas in the display area of the display device of FIG. 2. FIG. 6 is a schematic plan view illustrating the layout of the color filters in the display area of the display device of FIG. 2.

Referring to FIGS. 5 and 6, the display device 10 may include multiple pixels, for example, first, second, third, and fourth pixels PX1, PX2, PX3, and PX4, and emission areas (EA1, EA2, and EA3), which are disposed in the first, second, third, and fourth pixels PX1, PX2, PX3, and PX4. The display area DA of FIGS. 5 and 6 may correspond to the first area DA1, and the first, second, third, and fourth pixels PX1, PX2, PX3, and PX4 and the emission areas EA1, EA2, and EA3) may be disposed in the first display area DA1. Pixels and emission areas (EA1, EA2, and EA3) may also be disposed in the second or third display area DA2 or DA3.

The first, second, third, and fourth pixels PX1, PX2, PX3, and PX4 may be arranged in the first and second directions DR1 and DR2. The first and second pixels PX1 and PX2 may be disposed adjacent to each other in the first direction DR1, and the first and third pixels PX1 and PX3 may be disposed adjacent to each other in the second direction DR2. The third and fourth pixels PX3 and PX4 may be disposed adjacent to each other in the first direction DR1, and the second and fourth pixels PX2 and PX4 may be disposed adjacent to each other in the second direction DR2. The first, second, third, and fourth pixels PX1, PX2, PX3, and PX4 may be arranged as linear or island patterns in the display area DA.

The layout of the first, second, third, and fourth pixels PX1, PX2, PX3, and PX4 is not particularly limited. In another embodiment, in some embodiments, the first, second, third, and fourth pixels PX1, PX2, PX3, and PX4 may be arranged in a PenTile® fashion (e.g., a diamond Pen-Tile® fashion).

The emission areas (EA1, EA2, and EA3) of each of the first, second, third, and fourth pixels PX1, PX2, PX3, and PX4 may include first, second, and third emission areas EA1, EA2, and EA3. The first, second, and third emission areas EA1, EA2, and EA3 may emit red light, green light, and blue light, respectively, and the color of light emitted by each of the first, second, and third emission areas EA1, EA2, and EA3 may vary depending on the type of light-emitting elements ED (of FIG. 7) in the light-emitting element layer EML. The first emission area EA1 may emit first light, which is red light, the second emission area EA2 may emit second light, which is green light, and the third emission area EA3 may emit third light, which is blue light. However, the disclosure is not limited thereto.

First emission areas EA1, second emission areas EA2, and third emission areas EA3 may be arranged in the first direction DR1, the second direction DR2, and diagonal directions between the first and second directions DR1 and DR2. For example, the first emission areas EA1 and the second emission areas EA2 may be spaced apart from one another in the second direction DR2, in the first, second, third, and fourth pixels PX1, PX2, PX3, and PX4, and may be alternately arranged in the second direction DR2, over the entire display area DA. The first emission area EA1 of the third pixel PX3 may be disposed between the second emission areas EA2 of the first and third pixels PX1 and PX3. The third emission areas EA3 may be spaced apart from the first emission areas EA1 and the second emission areas EA2 in the diagonal directions, in the first, second, third, and fourth pixels PX1, PX2, PX3, and PX4, and may be repeatedly arranged in the second direction DR2 over the entire display area DA. For example, the third emission area EA3 of the first pixel PX1 may be disposed between the second emission areas EA2 of the first and second pixels PX1 and PX2.

The layout of the first emission areas EA1, the second emission areas EA2, and the third emission areas EA3 is not particularly limited. The first emission areas EA1, the second emission areas EA2, and the third emission areas EA3 may be arranged in a similar layout to the first, second, third, and fourth pixels PX1, PX2, PX3, and PX4, i.e., in the PenTile® fashion (e.g., the diamond PenTile®fashion).

The emission areas (EA1, EA2, and EA3) may be defined by multiple openings (OPE1, OPE2, and OPE3) formed in the pixel-defining film PDL of the light-emitting element layer EML. For example, the first emission areas EA1 may be defined by first openings OPE1 of the pixel-defining film PDL, the second emission areas EA2 may be defined by second openings OPE2 of the pixel-defining film PDL, and the third emission areas EA3 may be defined by third openings OPE3 of the pixel-defining film PDL.

The emission areas (EA1, EA2, and EA3) may have different sizes. In the example of FIG. 5, the second emission areas EA2 may be larger in size than the first emission areas EA1 and the third emission areas EA3, and the third emission areas EA3 may be larger in size than the first emission areas EA1. The size of the emission areas (EA1, EA2, and EA3) may vary depending on the size of the openings (OPE1, OPE2, and OPE3) of the pixel-defining film PDL. The intensity of light emitted from the emission areas (EA1, EA2, and EA3) may vary depending on the size of the emission areas (EA1, EA2, and EA3), and the screen colors displayed by the display device 10 or the electronic device 1 may be controlled by controlling the size of the emission areas (EA1, EA2, and EA3). In the example of FIG. 5, the second emission areas EA2 may have a largest size, but the disclosure is not limited thereto. The size of the emission areas (EA1, EA2, and EA3) can be controlled freely in accordance with the screen colors required by the display device 10 or the electronic device 1. Also, the size of the emission areas (EA1, EA2, and EA3) may be related to the efficiency and lifetime of the light-emitting elements ED and may have a trade-off relation with the reflection of external light. The size of the emission areas (EA1, EA2, and EA3) may be controlled in consideration of all the above.

In the example of FIG. 5, one first emission area EA1, one second emission area EA2, and one third emission area EA3, which are disposed adjacent to one another in each of the first, second, third, and fourth pixels PX1, PX2, PX3, and PX4, may form a single pixel group. One pixel group may include emission areas (EA1, EA2, and EA3) emitting different colors of light and may display white gradation. However, the disclosure is not limited thereto. For example, the combination of emission areas (EA1, EA2, and EA3) forming each pixel group may vary depending on the layout of the emission areas (EA1, EA2, and EA3) and the colors of light emitted from the emission areas (EA1, EA2, and EA3).

The display device 10 may include multiple color filters (CF1, CF2, and CF3), which are disposed on the emission areas (EA1, EA2, and EA3). The color filters (CF1, CF2, and CF3) may be disposed to correspond to the emission areas (EA1, EA2, and EA3). For example, the color filters (CF1, CF2, and CF3) may be disposed on a light-blocking layer BM (of FIG. 7) including multiple holes (OPT1, OPT2, and OPT3), which are disposed to correspond to the emission areas (EA1, EA2, and EA3) or the openings (OPE1, OPE2, and OPE3). The holes (OPT1, OPT2, and OPT3) may be formed to overlap the openings (OPE1, OPE2, and OPE3) and may form light output areas, from which the light emitted from the emission areas (EA1, EA2, and EA3) is output. The color filters (CF1, CF2, and CF3) may have a larger size than the holes (OPT1, OPT2, and OPT3) and the openings (OPE1, OPE2, and OPE3), and the color filters (CF1, CF2, and CF3) may completely cover the light output areas formed by the holes (OPT1, OP)2, and OPT3).

The color filters (CF1, CF2, and CF3) may include first color filters CF1, second color filters CF2, and third color filters CF3. The color filters (CF1, CF2, and CF3) may include a colorant such as a pigment or dye capable of absorbing all wavelengths of light except for a particular wavelength range and may be disposed to correspond to the colors of light emitted from the emission areas (EA1, EA2, and EA3). For example, the first color filters CF1 may be disposed to overlap the first emission areas EA1 and may be red color filters capable of transmitting only red light therethrough, the second color filters CF2 may be disposed to overlap the second emission areas EA2 and may be green color filters capable of transmitting only green light therethrough, and the third color filters CF3 may be disposed to overlap the third emission areas EA3 and may be blue color filters capable of transmitting only blue light therethrough.

The color filters (CF1, CF2, and CF3), like the emission areas (EA1, EA2, and EA3), may be arranged in the first direction DR1, the second direction DR2, and the diagonal directions between the first and second directions DR1 and DR2. For example, the first color filters CF1 and the second color filters CF2 may be spaced apart from one another in the second direction DR2 and may be alternately arranged in the second direction DR2, over the entire display area DA. The first color filter CF1 of the third pixel PX3 may be disposed between the second color filters CF2 of the first and third pixels PX1 and PX3. The third color filters CF3 may be spaced apart from the first color filters CF1 and the second color filters CF2 in the diagonal directions and may be repeatedly arranged in the second direction DR2 over the entire display area DA. For example, the third color filter CF3 of the first pixel PX1 may be disposed between the second color filters CF2 of the first and second pixels PX1 and PX2.

In some embodiments, the first color filters CF1 may include protruding parts protruding in the first direction DR1 from the first emission areas EA1 to adjoin the third color filters CF3 in the second direction DR2. The third color filter CF3 of the first pixel PX1 may be disposed between the protruding parts of the first color filters CF1 of the first and third pixels PX1 and PX3. The first color filters CF1 may have a different shape from the second color filters CF2 and the third color filters CF3, in the first, second, third, and fourth pixels PX1, PX2, PX3, and PX4. The first color filters CF1 may have the largest area fraction in unit areas. As the area fractions of the color filters (CF1, CF2, and CF3) relative to one another affect the color of reflected external light and the first color filters CF1, which are red color filters, have a relatively large area, the color of external light may become comfortable to the eyes of a user.

The layout of the color filters (CF1, CF2, and CF3) is not particularly limited. In another embodiment, the color filters (CF1, CF2, and CF3) may be arranged in a similar layout to the emission areas (EA1, EA2, and EA3), i.e., in the PenTile® fashion (e.g., the diamond PenTile® fashion). The layout of the protruding parts of the first color filters CF1 is also not particularly limited.

The color filters (CF1, CF2, and CF3) may be disposed to partially overlap one another. FIG. 6 illustrates that adjacent color filters (CF1, CF2, and CF3) adjoin one another, but in another embodiment, as will be described later, adjacent color filters (CF1, CF2, and CF3) may partially overlap one another at the boundaries therebetween. FIG. 6 illustrates the layout of the color filters (CF1, CF2, and CF3), as viewed from above the color filters (CF1, CF2, and CF3), and thus, it may be understood that the edges of color filters (CF1, CF2, and CF3) laid over by other color filters (CF1, CF2, and CF3) are hidden from view. The color filters (CF1, CF2, and CF3) may overlap one another on the light-blocking layer BM, which corresponds to an area not overlapping the emission areas (EA1, EA2, and EA3).

As the color filters (CF1, CF2, and CF3) are disposed to overlap one another, the intensity of reflected light of external light can be reduced. Also, the color of reflected light of external light can be controlled by controlling the layout, the shape, and size of the color filters (CF1, CF2, and CF3).

FIG. 7 is a schematic cross-sectional view taken along line VII-VII' of FIG. 5. FIG. 7 illustrates a cross-sectional view taken across the first, second, and third emission areas EA1, EA2, and EA3 of the first pixel PX1 of FIG. 5.

The cross-sectional structure of the display device 10 will hereinafter be described with reference to FIG. 7 and further to FIGS. 5 and 6. The display panel 100 of the display device 10 may include the display layer DU and the color filer layer CFL. The display layer DU may include the substrate SUB, the TFT layer TFTL, the light-emitting element layer EML, and the encapsulation layer TFEL. The display panel 100 may include the light-blocking layer BM, which is disposed on the encapsulation layer TFEL, and the color filters (CF1, CF2, and CF3) of the color filter layer CFL may be disposed on the light-blocking layer BM.

The substrate SUB may be a base substrate or a base member. The substrate SUB may be a flexible substrate that is bendable, foldable, and/or rollable. For example, the substrate SUB may include a polymer resin such as PI, but the disclosure is not limited thereto. In another example, the substrate SUB may include a glass or metal material.

The TFT layer TFTL may include a first buffer layer BF1, a lower metal layer BML, a second buffer layer BF2, TFTs "TFT", a gate insulating layer GI, a first interlayer insulating layer ILD1, capacitor electrodes CPE, a second interlayer insulating layer ILD2, first connecting electrodes CNE1, a first passivation layer PAS1, second connecting electrodes CNE2, and a second passivation layer PAS2.

The first buffer layer BF1 may be disposed on the substrate SUB. The first buffer layer BF1 may include an inorganic film capable of preventing the infiltration of the air or moisture. For example, the first buffer layer BF1 may include multiple inorganic films that are alternately stacked on each other.

The lower metal layer BML may be disposed on the first buffer layer BF1. For example, the lower metal layer BML may be formed as a single layer or a multilayer including molybdenum (Mo), aluminum (Al), chromium (Cr), gold (Au), titanium (Ti), nickel (Ni), neodymium (Nd), copper (Cu), and/or an alloy thereof, but the disclosure is not limited thereto.

The second buffer layer BF2 may cover the first buffer layer BF1 and the lower metal layer BML. The second buffer layer BF2 may include an inorganic film capable of preventing the infiltration of the air or moisture. For example, the second buffer layer BF2 may include multiple inorganic films that are alternately stacked on each other.

The TFTs "TFT" may be disposed on the second buffer layer BF2 and may form the pixel circuitry of multiple pixels. For example, the TFTs "TFT" may be driving transistors or switching transistors. The TFTs "TFT" may include semiconductor layers ACT, source electrodes SE, drain electrodes DE, and gate electrodes GE.

The semiconductor layers ACT may be disposed on the second buffer layer BF2. The semiconductor layers ACT may overlap the lower metal layer BML and the gate electrodes GE in the thickness direction and may be insulated from the gate electrodes GE by the gate insulating layer GI. Parts of the semiconductor layers ACT may be transformed into conductors and may thus form the source electrodes SE and the drain electrodes DE.

The gate electrodes GE may be disposed on the gate insulating layer GI. The gate electrodes GE may overlap the semiconductor layers ACT with the gate insulating layer GI interposed therebetween.

The gate insulating layer GI may be disposed on the semiconductor layers ACT. For example, the gate electrodes GE may cover the semiconductor layers ACT and the second buffer layer BF2 and may insulate the semiconductor layers ACT and the gate electrodes GE. The gate insulating layer GI may include contact holes that are penetrated by the first connecting electrodes CNE1.

A first interlayer insulating layer ILD1 may cover the gate electrodes GE and the gate insulating layer GI. The first interlayer insulating layer ILD1 may include contact holes that are penetrated by the first connecting electrodes CNE1. The contact holes of the first interlayer insulating layer ILD1 may be connected to the contact holes of the gate insulating layer GI and contact holes of a second interlayer insulating layer ILD2.

The capacitor electrodes CPE may be disposed on the first interlayer insulating layer ILD1. The capacitor electrodes CPE may overlap the gate electrodes GE in the thickness direction. The capacitor electrodes CPE and the gate electrodes GE may form capacitors.

The second interlayer insulating layer ILD2 may cover the capacitor electrodes CPE and the first interlayer insulating layer ILD1. The second interlayer insulating layer ILD2 may include contact holes that are penetrated by the first connecting electrodes CNE1. The contact holes of the second interlayer insulating layer ILD2 may be connected to the contact holes of the first interlayer insulating layer ILD1 and the contact holes of the gate insulating layer GI.

The first connecting electrodes CNE1 may be disposed on the second interlayer insulating layer ILD2. The first connecting electrodes CNE1 may electrically connect the drain electrodes DE of the TFTs "TFT" and the second connecting electrodes CNE2. The first connecting electrodes CNE1 may be inserted in the contact holes of each of the second interlayer insulating layer ILD2, the first interlayer insulating layer ILD1, and the gate insulating layer GI and may thus be in contact with the drain electrodes DE of the TFTs "TFT".

The first passivation layer PAS1 may cover the first connecting electrodes CNE1 and the second interlayer insulating layer ILD2. The first passivation layer PAS1 may protect the TFTs "TFT". The first passivation layer PAS1 may include contact holes that are penetrated by the second connecting electrodes CNE2.

The second connecting electrodes CNE2 may be disposed on the first passivation layer PAS1. The second connecting electrodes CNE2 may electrically connect the first connecting electrodes CNE1 and pixel electrodes AE of light-emitting elements ED. The second connecting electrodes CNE2 may be inserted in the contact holes of the first passivation layer PAS1 and may be in contact with the first connecting electrodes CNE1.

The second passivation layer PAS2 may cover the second connecting electrodes CNE2 and the first passivation layer PAS1. The second passivation layer PAS2 may include contact holes that are penetrated by the pixel electrodes AE of the light-emitting elements ED.

The light-emitting element layer EML may be disposed on the TFT layer TFTL. The light-emitting element layer EML may include the light-emitting elements ED and the pixel-defining film PDL. The light-emitting elements ED may include the pixel electrodes AE, light-emitting layers EL, and a common electrode CE.

The pixel electrodes AE may be disposed on the second passivation layer PAS2. The pixel electrodes AE may be disposed to overlap first, second, and third openings OPE1, OPE2 and OPE3 of a pixel-defining film PDL. The pixel electrodes AE may be electrically connected to the drain electrodes DE of the TFTs "TFT" via the first connecting electrodes CNE1 and the second connecting electrodes CNE2.

The light-emitting layers EL may be disposed on parts of the pixel electrodes AE. For example, the light-emitting layers EL may be organic light-emitting layers formed of an organic material. As the TFTs "TFT" may apply a predetermined or given voltage to the pixel electrodes AE of the light-emitting elements ED and the common electrode CE of the light-emitting elements ED receives a common voltage or a cathode voltage, holes and electrons may move to the light-emitting layers EL through hole transport layers and electron transport layers, respectively, and may combine together in the light-emitting layers EL to emit light.

The common electrode CE may be disposed on the light-emitting layers EL. For example, the common electrode CE may be formed in the entire display area DA not as an electrode separate for each individual pixel, but as an electrode shared in common by all the pixels. The common electrode CE may be disposed on the light-emitting layers EL, in the first, second, and third emission areas EA1, EA2, and EA3, and on the pixel-defining film PDL, in areas other than the first, second, and third emission areas EA1, EA2, and EA3.

The common electrode CE may receive a common voltage or a low-potential voltage. As the pixel electrodes AE receive a voltage corresponding to a data voltage and the common electrode CE receives a low-potential voltage, an electric potential difference may be generated between the pixel electrodes AE and the common electrode CE, and as a result, the light-emitting layers EL may emit light.

The pixel-defining film PDL may include the first, second, and third openings OPE1, OPE2, and OPE3 and may be disposed on the second passivation layer PAS2 and on parts of the pixel electrodes AE. The first, second, and third openings OPE1, OPE2, and OPE3 of the pixel-defining film PDL may expose parts of the pixel electrodes AE. As already mentioned above, the first, second, and third openings OPE1, OPE2, and OPE3 of the pixel-defining film PDL may define the first, second, and third emission areas EA1, EA2, and EA3, respectively, and may have different sizes. The pixel-defining film PDL may separate and insulate the pixel electrodes AE of the light-emitting elements ED from pixel electrodes AE of other light-emitting elements ED. The pixel-defining film PDL may include a light-absorbing material and may thus prevent the reflection of light. For example, the pixel-defining film PDL may include a PI-based binder and the mixture of red, green, and blue pigments. In another embodiment, the pixel-defining film PDL may include a cardo-based binder resin and the mixture of a lactam black pigment and a blue pigment. In another embodiment, the pixel-defining film PDL may include carbon black.

The encapsulation layer TFEL may be disposed on the common electrode CE and may cover the light-emitting elements ED. The encapsulation layer TFEL may include at least one inorganic film and may prevent the infiltration of oxygen or moisture into the light-emitting element layer EML. The encapsulation layer TFEL may also include at least one organic film and may protect the light-emitting element layer EML from a foreign material such as dust.

The encapsulation layer TFEL may include first, second, and third encapsulation layers TFE1, TFE2, and TFE3. The first and third encapsulation layers TFE1 and TFE3 may be inorganic encapsulation layers, and the second encapsulation layer TFE2, which is disposed between the first and third encapsulation layers TFE1 and TFE3, may be an organic encapsulation layer.

The first and third encapsulation layers TFE1 and TFE3 may include an inorganic insulating material. The inorganic insulating material may include aluminum oxide, titanium oxide, tantalum oxide, hafnium oxide, zinc oxide, silicon oxide, silicon nitride, and/or silicon oxynitride.

The second encapsulation layer TFE2 may include a polymer material. The polymer material may include an acrylic resin, an epoxy resin, polyimide, and/or polyethylene. The second encapsulation layer TFE2 may include an acrylic resin, for example, polymethyl methacrylate or polyacrylic acid. The second encapsulation layer TFE2 may be formed by curing a monomer or applying a polymer.

The light-blocking layer BM may be disposed on the encapsulation layer TFEL. The light-blocking layer BM may include the holes (OPT1, OPT2, and OPT3), which are disposed to overlap the emission areas (EA1, EA2, and EA3). For example, a first hole OPT1 may be disposed to overlap the first emission area EA1 or the first opening OPE1, a second hole OPT2 may be disposed to overlap the second emission area EA2 or the second opening OPE2, and a third hole OPT3 may be disposed to overlap the third emission area EA3 or the third opening OPE3. The holes (OPT1, OPT2, and OPT3) may have a larger area or size than the openings (OPE1, OPE2, and OPE3) of the pixel-defining film PDL. As the holes (OPT1, OPT2, and OPT3) of the light-blocking layer BM are formed to be larger than the openings (OPE1, OPE2, and OPE3) of the pixel-defining film PDL, light emitted from the emission areas (EA1, EA2, and EA3) can be visible to the user not only at the front, but also at the sides of the display device 10.

The light-blocking layer BM may include a light-absorbing material. For example, the light-blocking layer BM may include an inorganic black pigment or an organic black pigment. The inorganic black pigment may be, but is not limited to, carbon black, and the organic black pigment may include, but is not limited to, at least one of lactam black, perylene black, and aniline black. The light-blocking layer BM can prevent visible light from infiltrating between the first, second, and third emission areas EA1, EA2, and EA3 to cause color mixing and can thus improve the color reproducibility of the display device 10.

The color filters (CF1, CF2, and CF3) of the color filter layer CFL may be disposed on the light-blocking layer BM. The color filters (CF1, CF2, and CF3) may be disposed to correspond to the emission areas (EA1, EA2, and EA3), the openings (OPE1, OPE2, and OPE3), and the holes (OPT1, OPT2, and OPT3). For example, a first color filter CF1 may be disposed to correspond to the first emission area EA1, a second color filter CF2 may be disposed to correspond to the second emission area EA2, and a third color filter CF3 may be disposed to correspond to the third emission area EA3. The first color filter CF1 may be disposed in the first hole OPT1 of the light-blocking layer BM, the second color filter CF2 may be disposed in the second hole OPT2 of the light-blocking layer BM, and the third color filter CF3 may be disposed in the third hole OPT3 of the light-blocking layer BM. The color filters (CF1, CF2, and CF3) may have a larger area than the holes (OPT1, OPT2, and OPT3) of the light-blocking layer BM, and parts of the color filters (CF1, CF2, and CF3) may be disposed directly on the light-blocking layer BM.

A planarization layer OC may be disposed on the color filters (CF1, CF2, and CF3) and may planarize the tops of the color filters (CF1, CF2, and CF3). The planarization layer OC may be a colorless light-transmitting layer not having a color in a visible wavelength range. For example, the planarization layer OC may include a colorless light-transmitting organic material such as an acrylic resin.

The color filters (CF1, CF2, and CF3) may be disposed to overlap one another on the light-blocking layer BM. The color filters (CF1, CF2, and CF3) may be disposed to completely cover the light-blocking layer BM. The color filters (CF1, CF2, and CF3) may be disposed to partially overlap one another on the light-blocking layer BM. As the color filters (CF1, CF2, and CF3) overlap one another, the reflection of external light by the light-blocking layer BM can be reduced. The color filters (CF1, CF2, and CF3) may be designed to overlap one another to properly reduce the reflection of external light.

The first and second color filters CF1 and CF2, which are adjacent to each other, may be disposed to overlap each other on the light-blocking layer BM, and the second and third color filters CF2 and CF3, which are adjacent to each other, may be disposed to overlap each other on the light-blocking layer BM. The first color filter CF1 and another third color filter CF3 (not illustrated), which is adjacent to the first color filter CF1, may be disposed to overlap one another on the light-blocking layer BM.

The second color filer CF2, which is a green color filter, may be disposed above the first and third color filters CF1 and CF3, which are red and blue color filters, respectively. The third color filter CF3, which is a blue color filter, may be disposed above the first color filter CF1, which is a red color filter. The color filters (CF1, CF2, and CF3) may be formed by a photoresist process. The color filters (CF1, CF2, and CF3) may be formed in the order of the first, third, and second color filters CF1, CF3, and CF2, but the disclosure is not limited thereto. In another embodiment, the first color filter CF1, which is a red color filter, may be disposed above the second and third color filters CF2 and CF3. The color filters (CF1, CF2, and CF3) may be formed in the order of the second, third, and first color filters CF2, CF3, and CF1.

The light-blocking layer BM may include a material capable of absorbing light, but some of light incident from the outside may be reflected by the light-blocking layer BM. Parts of the color filters (CF1, CF2, and CF3), which are disposed in the holes (OPT1, OPT2, and OPT3) of the light-blocking layer BM, may be disposed directly on the light-blocking layer BM to completely cover the light-blocking layer BM. As neighboring color filters (CF1, CF2, and CF3) include different colorants and are disposed to overlap one another on the light-blocking layer BM, the reflection of external light by the light-blocking layer BM can be reduced. The transmittance of the color filters (CF1, CF2, and CF3) may vary depending on the material of the color filters (CF1, CF2, and CF3), and the reflection of external light can be further reduced depending on the order in which the color filters (CF1, CF2, and CF3) overlap one another.

External light may be reflected by the emission areas (EA1, EA2, and EA3), the light-blocking layer BM, and light-transmitting areas formed by the holes (OPT1, OPT2, and OPT3) of the light-blocking layer BM. The reflection of external light in the emission areas (EA1, EA2, and EA3) and the light-transmitting areas may be controlled by controlling the size of the openings (OPE1, OPE2, and OPE3) of the pixel-defining film PDL and the size of, and the distance between, the holes (OPT1, OPT2, and OPT3) of the light-blocking layer BM. However, the general efficiency and lifetime of the display device 10 and the optical efficiency of the display device 10 such as side visibility may be affected. On the contrary, if the color filters (CF1, CF2, and CF3) are disposed to overlap one another on the light-blocking layer BM, the reflection of external light by the light-blocking layer BM can be considerably reduced without affecting the optical efficiency of the display device 10. Also, the color of reflected light can be controlled for the convenience of the user by controlling the size and thickness of the color filters (CF1, CF2, and CF3) and the width of parts of the color filters (CF1, CF2, and CF3) overlapping one another. For example, the color of reflected light in the emission areas (EA1, EA2, and EA3) and the light-transmitting areas may vary depending on the size of the color filters (CF1, CF2, and CF3), and the color of reflected light from the light-blocking layer BM may vary depending on the size or width of the parts of the color filters (CF1, CF2, and CF3) overlapping one another.

External light incident into the holes (OPT1, OPT2, and OPT3) of the light-blocking layer BM may be reflected by the pixel electrodes AE and the common electrode CE, which may include a highly-reflective material. Since the common electrode CE is disposed on the pixel-defining film PDL, along the inclined sides of the pixel-defining film PDL, the reflection of external light may be highly attributable to the common electrode CE. The pixel-defining film PDL includes the openings (OPE1, OPE2, and OPE3), which are arranged at regular intervals, but as reflected light from the sides of each of the openings (OPE1, OPE2, and OPE3) is diffracted and interfered with, a particular diffraction pattern may appear as speckles depending on the layout of the openings (OPE1, OPE2, and OPE3), causing dissatisfaction for the user.

To address this, the display device 10 may have a structure capable of dispersing the diffraction pattern of reflected light or preventing the diffraction pattern of reflected light from appearing as speckles, even if beams of reflected light from the sides of each of the openings (OPE1, OPE2, and OPE3) interfere with one another. The sides of each of the openings (OPE1, OPE2, and OPE3) of the pixel-defining film PDL may not be rectilinear, but may include concave-convex patterns. As the sides of each of the openings (OPE1, OPE2, and OPE3) of the pixel-defining film PDL include concave-convex patterns, light may be reflected randomly, rather than uniformly, from the sides of each of the openings (OPE1, OPE2, and OPE3) and may thus appear as random patterns. Also, even if the openings (OPE1, OPE2, and OPE3) have a repeated pattern of arrangement, the interference of reflected light may not be so severe so as to cause dissatisfaction for the user. The shape of the openings (OPE1, OPE2, and OPE3) of the pixel-defining film PDL will hereinafter be described.

FIG. 8 is a schematic plan view illustrating the layout of emission areas in a pixel of FIG. 5. FIG. 9 is a schematic plan view illustrating the layout of color filters in a pixel of FIG. 6. FIG. 10 is a schematic plan view illustrating an opening of the display device of FIG. 2.

FIG. 8 illustrates the shapes of the first, second and third emission areas EA1, EA2, and EA3 in the first pixel PX1 of FIG. 5, and FIG. 9 illustrates the shapes of the first, second, and third color filters CF1, CF2, and CF3 and the first, second, and third holes OPT1, OPT2, and OPT3 in the first pixel PX1 of FIG. 6. FIG. 10 illustrates the shape of one of the openings (OPE1, OPE2, and OPE3) of the pixel-defining film PDL, i.e., the shape of a second opening OPE2.

Referring to FIGS. 8 through 10, the display device 10 may include multiple emission areas (EA1, EA2, and EA3) in each pixel, and the emission areas (EA1, EA2, and EA3) may be defined by the openings (OPE1, OPE2, and OPE3) of the pixel-defining film PDL. Each of the openings (OPE1, OPE2, and OPE3) of the pixel-defining film PDL may have sides with concave-convex patterns or wavy sides.

The shape of the sides of each of the openings (OPE1, OPE2, and OPE3) may vary depending on the shape of a mask for use in forming the openings (OPE1, OPE2, and OPE3) in the pixel-defining film PDL. During a patterning process for forming the openings (OPE1, OPE2, and OPE3), a mask having a concave-convex pattern or a curvy pattern may be used, and as a result, the sides of each of the openings (OPE1, OPE2, and OPE3) may be formed into a concave-convex or wavy shape accordingly.

Referring to FIG. 10, imaginary lines (IL1 and IL2) extending across both ends of each of the sides of the second opening OPE2 may be defined. For example, first imaginary lines IL1 extending across both ends of each of the sides, in the second direction DR2, of the second opening OPE2 and second imaginary lines IL2 extending across both ends of each of the sides, in the first direction DR1, of the second opening OP2 may be defined. Each of the sides of the second opening OPE2 may include convex portions that protrude outwardly beyond the first or second imaginary lines IL1 or IL2 and concave portions that are depressed inwardly from the first or second imaginary lines IL1 or IL2. Each of the sides of the second opening OPE2 may include first parts P1, which correspond to the outermost parts of the convex portions, second parts P2, which correspond to the inner-most parts of the concave portions, and third parts P3, which fall on the first or second imaginary lines IL1 or IL2. The first parts P1 may be embossed parts of concave-convex patterns of the sides of the second opening OPE2, and the second parts P2 may be engraved parts of the concave-convex patterns of the sides of the second opening OPE2.

A pattern depth BD of the sides of each of the openings (OPE1, OPE2, and OPE3) may be defined based on the first parts P1 and the second parts P2. For example, the pattern depth BD may be defined as the vertical distance from imaginary lines or surfaces that adjoin the first parts P1 to the second parts P2. In another embodiment, the pattern depth BD may be defined as the sum of the depths of the concave portions and the convex portions of the concave-convex patterns of the sides of each of the openings (OPE1, OPE2, and OPE3). A pattern width BW of the sides of each of the openings (OPE1, OPE2, and OPE3) may be defined. The pattern width BW may be defined as the distance between the concave portions or the convex portions of each of the sides of each of the openings (OPE1, OPE2, and OPE3). In another embodiment, the pattern width BW may be defined as the width of the concave portions or the convex portions of each of the sides of each of the openings (OPE1, OPE2, and OPE3). FIG. 10 illustrates that the pattern width BW is the distance between the third parts P3 of each of the sides of each of the openings (OPE1, OPE2, and OPE3), but the disclosure is not limited thereto. In another embodiment, the pattern width BW may be the distance between the first parts P1, between the second parts P2, or between the first parts P1 and the second parts P2.

The more the concave portions and the convex portions of each of the sides of each of the openings (OPE1, OPE2, and OPE3), the less the pattern width BW. Accordingly, the more the first parts P1 and the second parts P2 are repeated, the better the diffractive dispersing of reflected light of external light. Also, as the pattern depth BD decreases, sufficient opening areas may be secured, and the efficiency of the emission areas (EA1, EA2, and EA3) may increase. There is a predetermined or given ratio correlation between the pattern depth BD/the pattern width BW of the sides of each of the openings (OPE1, OPE2, and OPE3) and the diameter or an opening width OPL of each of the openings (OPE1, OPE2, and OPE3). However, as already mentioned above, the sides of each of the openings (OPE1, OPE2, and OPE3) may be formed by a patterning process using a mask, and the pattern depth BD and the pattern width BW of the sides of each of the openings (OPE1, OPE2, and OPE3) may be affected by the limit resolution of the patterning process.

The pattern depth BD of the sides of each of the openings (OPE1, OPE2, and OPE3) may be about $\frac{1}{40}$ to about $\frac{1}{2}$ of the opening width OPL of each of the openings (OPE1, OPE2, and OPE3), and the pattern width BW of the sides of each of the openings (OPE1, OPE2, and OPE3) may be about $\frac{1}{20}$ to about 1/1 of the opening width OPL of each of the openings (OPE1, OPE2, and OPE3). The pattern depth BD and the pattern width BW of the sides of each of the openings (OPE1, OPE2, and OPE3) may be set to about 3 μm to about 5 μm in consideration of the limit resolution of the patterning process. The opening width OPL of each of the openings (OPE1, OPE2, and OPE3) may vary depending on the pattern depth BD and the pattern width BW of the sides of each of the openings (OPE1, OPE2, and OPE3).

The less the pattern width BW of the sides of each of the openings (OPE1, OPE2, and OPE3), the greater the numbers of concave portions and convex portions of each of the sides of each of the openings (OPE1, OPE2, and OPE3), and the larger the pattern width BW of the sides of each of the openings (OPE1, OPE2, and OPE3), the smaller the numbers of concave portions and convex portions of each of the sides of each of the openings (OPE1, OPE2, and OPE3). The less the pattern depth BD of the sides of each of the openings (OPE1, OPE2, and OPE3), the larger the area of each of the openings (OPE1, OPE2, and OPE3), and the larger the pattern depth BD of the sides of each of the openings (OPE1, OPE2, and OPE3), the less the area of each of the openings (OPE1, OPE2, and OPE3). Accordingly, the pattern depth BD and the pattern width BW of the sides of each of the openings (OPE1, OPE2, and OPE3) may be appropriately set in consideration of the efficiency of the emission areas (EA1, EA2, and EA3), required by the display device 10, the degree of diffractive dispersing of reflected light, and the limit resolution of the patterning process.

The second opening OPE2 of FIG. 10 may have the same opening width OPL in both the first and second directions DR1 and DR2, and the ratios of the pattern depth BD and the pattern width BW of the sides, in the first direction DR1, of the second opening OPE2 to the opening width OPL of the second opening OPE2 may be the same as the ratios of the pattern depth BD and the pattern width BW of the sides, in the second direction DR2, of the second opening OPE2 to the opening width OPL of the second opening OPE2. For example, if the ratios of the pattern depth BD and the pattern width BW of the sides, in the first direction DR1, of the second opening OPE2 to the opening width OPL of the second opening OPE2 are about ⅒ and about ⅕, respectively, the ratios of the pattern depth BD and the pattern width BW of the sides, in the second direction DR2, of the second opening OPE2 to the opening width OPL of the second opening OPE2 may also be about ⅒ and about ⅕, respectively.

However, if the second opening OPE2, like first and third openings OPE1 and OPE3, has different opening widths OPL in the first and second directions DR1 and DR2, the ratios of the pattern depth BD and the pattern width BW of the sides, in the first direction DR1, of the second opening OPE2 to the opening width OPL, in the first direction DR1, of the second opening OPE2 may differ from the ratios of the pattern depth BD and the pattern width BW of the sides, in the second direction DR2, of the second opening OPE2 to the opening width OPL, in the second direction DR2, of the second opening OPE2. For example, as a first opening OPE1 has a larger opening width OPL in the first direction DR1 than in the second direction DR2, the ratios of the pattern depth BD/the pattern width BW of the sides of the first opening OPE1 to the opening widths OPL of the first opening OPE1 may differ from each other if the pattern depth BD and the pattern width BW of the sides of the first opening OPE1 are the same. The ratio of the pattern depth BD/the pattern width BW of the sides of each of the openings (OPE1, OPE2, and OPE3) to the opening width of each of the openings (OPE1, OPE2, and OPE3) may vary depending on the shape of each of the openings (OPE1, OPE2, and OPE3).

In the example of FIGS. 8 through 10, the sides of each of the openings (OPE1, OPE2, and OPE3) may include the first parts P1, which protrude outwardly beyond the imaginary lines (IL1 and IL2), and the second parts P2, which are depressed inwardly from the imaginary lines (IL1 and IL2), but the disclosure is not limited thereto, but the disclosure is not limited thereto. The concave-convex patterns of the sides of each of the openings (OPE1, OPE2, and OPE3) are not particularly limited, but may vary. This will be described later in detail.

As the sides of each of the openings (OPE1, OPE2, and OPE3) include concave-convex patterns, the sides of each of the openings (OPE1, OPE2, and OPE3) can disperse the diffraction of reflected light from the common electrode CE on the pixel-defining film PDL. On the contrary, as illustrated in FIG. 9, the sides of each of the holes (OPT1, OPT2, and OPT3) of the light-blocking layer BML and the sides of each of the color filters (CF1, CF2, and CF3) may not include concave-convex patterns, but may be rectilinear, extending in one direction, but the disclosure is not limited thereto. The sides of each of the holes (OPT1, OPT2, and OPT3) of the light-blocking layer BML and the sides of each of the color filters (CF1, CF2, and CF3), like the sides of each of the openings (OPE1, OPE2, and OPE3), may include concave-convex patterns.

As the sides of each of the openings (OPE1, OPE2, and OPE3) of the pixel-defining film PDL include concave-convex patterns, the display device 10 can disperse the diffraction of reflected light of external light. As a result, the diffraction of the reflected light can be prevented from appearing as becoming visible as speckles, a satisfying feeling of use can be provided even in case that the display device 1 is used outdoors under strong external light, and a screen displayed by the display device 10 can further become vivid and clear.

The shape of the sides of each of the openings (OPE1, OPE2, and OPE3) may vary as long as the sides of each of the openings (OPE1, OPE2, and OPE3) can properly disperse the diffraction of reflected light of external light. Display devices according to other embodiments of the disclosure, including multiple openings (OPE1, OPE2, and OPE3) with various side patterns, will hereinafter be described.

FIGS. 11 through 13 are schematic plan views illustrating the layout of emission areas in display areas of display devices according to other embodiments of the disclosure. FIGS. 11 through 13 illustrate various side patterns of openings (OPE1, OPE2, and OPE3) of display devices 10_1, 10_2, and 10_3.

Referring to the display device 10_1 of FIG. 11, the sides of each of emission areas (EA1, EA2, and EA3) or openings (OPE1, OPE2, and OPE3), which are disposed in each of first, second, third, and fourth pixels PX1, PX2, PX3, and PX4, may include concave or engraved portions. The sides of each of the openings (OPE1, OPE2, and OPE3) may include only concave or engraved portions depressed inwardly from imaginary lines (IL1 and IL2 of FIG. 10). The sides of each of the openings (OPE1, OPE2, and OPE3) may include second parts P2 and third parts P3, but do not include first parts P1 projected outwardly from the imaginary lines, unlike in the example of FIG. 10.

The sides of each of the openings (OPE1, OPE2, and OPE3) may include only recesses depressed inwardly from the imaginary lines and may thus have an engraved pattern structure with no protrusions projected outwardly from the imaginary lines. Even though the sides of each of the openings (OPE1, OPE2, and OPE3) have an engraved pattern structure, the sides of each of the openings (OPE1, OPE2, and OPE3) can properly disperse the diffraction of reflected light of external light.

Referring to the display device 10_2 of FIG. 12, the sides of each of emission areas (EA1, EA2, and EA3) or openings (OPE1, OPE2, and OPE3), which are disposed in each of first, second, third, and fourth pixels PX1, PX2, PX3, and PX4, may include convex or embossed portions. The sides of each of the openings (OPE1, OPE2, and OPE3) may include only convex or embossed portions projected outwardly from imaginary lines (IL1 and IL2 of FIG. 10). The sides of each of the openings (OPE1, OPE2, and OPE3) may include first parts P1 and third parts P3, but do not include second parts P2 depressed inwardly from the imaginary lines, unlike in the example of FIG. 10.

The sides of each of the openings (OPE1, OPE2, and OPE3) may include only protrusions projected outwardly from the imaginary lines and may thus have an embossed pattern structure with no recesses depressed inwardly from the imaginary lines. Even though the sides of each of the openings (OPE1, OPE2, and OPE3) have an embossed pattern structure, the sides of each of the openings (OPE1, OPE2, and OPE3) can properly disperse the diffraction of reflected light of external light.

Referring to the display device 10_3 of FIG. 13, the sides of each of emission areas (EA1, EA2, and EA3) or openings (OPE1, OPE2, and OPE3), which are disposed in each of first, second, third, and fourth pixels PX1, PX2, PX3, and PX4, may include engraved portions and embossed portions that are randomly formed. The sides of each of the openings (OPE1, OPE2, and OPE3) may include embossed portions projected outwardly from imaginary lines (IL1 and IL2 of FIG. 10) and engraved portions depressed inwardly from the imaginary lines, and the embossed portions and the engraved portions may be formed without any particular rules associated with an opening width OPL (of FIG. 10) of each of the openings (OPE1, OPE2, and OPE3). Even though the sides of each of the openings (OPE1, OPE2, and OPE3) have random concave-convex patterns, the sides of each of the openings (OPE1, OPE2, and OPE3) can properly disperse the diffraction of reflected light of external light.

FIGS. 14 and 15 are schematic plan views illustrating the layout of emission areas in display areas of display devices according to other embodiments of the disclosure.

Referring to display devices 10_4 and 10_5 of FIGS. 14 and 15, a pattern width BW of the sides of each opening (OPE1, OPE2, and OPE3) may be almost the same as an opening width OPL of each opening (OPE1, OPE2, and OPE3). Each of the sides of each opening (OPE1, OPE2, and OPE3) may include one concave or engraved portion. Referring to the display device 10_4 of FIG. 14, the pattern depth BW of the sides of each of the openings (OPE1, OPE2, and OPE3) may be less than about ½ of the opening width OPL of each of the openings (OPE1, OPE2, and OPE3). Referring to the display device 10_5 of FIG. 15, the pattern depth BW of the sides of each of the openings (OPE1, OPE2, and OPE3) may be about ½ of the opening width OPL of each of the openings (OPE1, OPE2, and OPE3).

The concave-convex patterns of the sides of each of the openings (OPE1, OPE2, and OPE3) may have a relatively large pattern depth BD and a relatively large pattern width BW. As the pattern depth BD and the pattern width BW of the concave-convex patterns of the sides of each of the openings (OPE1, OPE2, and OPE3) are greater than the limit resolution of a patterning process for forming the openings (OPE1, OPE2, and OPE3), the concave-convex patterns of the sides of each of the openings (OPE1, OPE2, and OPE3) can be formed almost as designed. Also, the sides of each of the openings (OPE1, OPE2, and OPE3) can properly disperse the diffraction of reflected light of external light, and the reflected light can be prevented from becoming visible as speckles.

The display devices 10_4 and 10_5 may have different layouts of emission areas (EA1, EA2, and EA3) in each of first, second, third, and fourth pixels PX1, PX2, PX3, and PX4 from the display devices 10, 10_1, 10_2, and 10_3 due to the shape of the sides of each of the openings (OPE1, OPE2, and OPE3) thereof. For example, first emission areas EA1 and third emission areas EA3 may be spaced apart from one another in a first direction DR1 and may be alternately arranged in the first direction DR1 and in a second direction DR2.

Second emission areas EA2 may be spaced apart from one another in the first and second directions DR1 and DR2 and from the first emission areas EA1 and the third emission areas EA3 in diagonal directions between the first and second directions DR1 and DR2. The second emission areas EA2 may be repeatedly arranged along the first and second directions DR1 and DR2, and the second emission areas EA2 and the third emission areas EA3 may be alternately arranged along the diagonal directions.

Although not specifically illustrated, holes (OPT1, OPT2, and OPT3) of a light-blocking layer BM, which are disposed to overlap the openings (OPE1, OPE2, and OPE3), and color filters (CF1, CF2, and CF3), which are also disposed to overlap the openings (OPE1, OPE2, and OPE3), may have a similar layout to the openings (OPE1, OPE2, and OPE3).

FIG. 16 is a schematic plan view illustrating the layout of emission areas in a display area of a display device according to another embodiment of the disclosure.

Referring to a display device 10_6 of FIG. 16, the sides of each opening OPE1, OPE2, and OPE3), which are disposed in each of first, second, third, and fourth pixels PX1, PX2, PX3, and PX4, may have a curved shape, rather than a linear shape. The display device 10_6 may differ from the display device 10, 10_1, 10_2, 10_3, 10_4, and 10_5 at least in the shape of the sides of each of the openings OPE1, OPE2, and OPE3).

For example, in a plan view, each of the openings (OPE1, OPE2, and OPE3) may have a shape obtained by combining two partial circles or ellipses and may be inwardly depressed on both sides in a first direction DR1. As each of the openings (OPE1, OPE2, and OPE3) has curved sides, rather than linear sides, the sides of each of the openings (OPE1, OPE2, and OPE3) can disperse the diffraction of reflected light of external light. How the sides of each of the openings (OPE1, OPE2, and OPE3) can disperse the diffraction of reflected light of external light is as already mentioned above, and thus, a detailed description thereof will be omitted.

Third emission areas EA3 may be divided into first sub-emission areas SEA1 and second sub-emission areas SEA2. Two or more third openings OPE3 may be disposed in each of the first, second, third, and fourth pixels PX1, PX2, PX3, and PX4 and may be spaced apart from one another in a second direction DR2. The third openings OPE3 may be smaller in size than first openings OPE1 and second openings OPE2.

One first sub-emission area SEA1 and one second sub-emission area SEA2 may form one third emission area EA3 and may be disposed to overlap a pixel electrode AE of a light-emitting element ED and with a third color filter CF3. The first sub-emission areas SEA1 and the second sub-emission areas SEA2 are illustrated as being separate parts of the third emission areas EA3, but may actually be emission areas emitting light of substantially the same color.

FIGS. 17 through 19 are schematic plan views illustrating the layout of emission areas in display areas of display devices according to other embodiments of the disclosure.

Referring to a display device 10_7 of FIG. 17, the intersection of every two different sides of each opening (OPE1, OPE2, and OPE3), which are disposed in each of first, second, third, and fourth pixels PX1, PX2, PX3, and PX4, may be rounded, and the rest of the sides of each of the openings (OPE1, OPE2, and OPE3) may be linear. As each of the openings (OPE1, OPE2, and OPE3) has protruding rounded corners, the openings (OPE1, OPE2, and OPE3) can disperse the diffraction of reflected light of external light. However, since the sides of each of the openings (OPE1, OPE2, and OPE3) are linear in part, the diffraction pattern of reflected light of external light may become visible. However, if the intensity of the diffraction pattern of the reflected light is not too high, the shape of the sides of each of the openings (OPE1, OPE2, and OPE3) can be simplified, and as a result, any product defects that may be caused by the limit resolution of a patterning process for forming the openings (OPE1, OPE2, and OPE3) can be minimized.

Each of the openings (OPE1, OPE2, and OPE3) may have rounded corners, and the openings (OPE1, OPE2, and OPE3) may be divided into first openings OPE1/second openings OPE2 and third openings OPE3 depending on the directions faced by the rounded corners of each of the openings (OPE1, OPE2, and OPE3. For example, the rounded corners of each of the first openings OPE1 and the second openings OPE2 may be disposed to face a diagonal direction, and the sides of each of the first openings OPE1 and the second openings OPE2 may be parallel to a first or second direction DR1 or DR2. On the contrary, the rounded corners of each of the third openings OPE3 of third emission areas EA3 may be disposed to face the first and second directions DR1 and DR2, and the sides of each of the third openings OPE3 may be parallel to a diagonal direction. Since the sides of each of the openings (OPE1, OPE2, and OPE3) are linear in part, light reflected from the sides of every two adjacent openings (e.g., first and third openings OPE1 and OPE3) arranged in parallel may overlap. To prevent this, the openings (OPE1, OPE2, and OPE3) may be designed such that every two adjacent openings arranged in parallel may have their corners face different directions not to form a repeated pattern.

The layout of first emission areas EA1, second emission areas EA2, and third emission areas EA3 or the layout of the first openings OPE1, the second openings OPE2, and the third openings OPE3 may be the same as in the embodiments of FIGS. 14 and 15, but the disclosure is not limited thereto. In another embodiment, the layout of the first openings OPE1, the second openings OPE2, and the third openings OPE3 may be the same as in the embodiment of FIG. 5.

Referring to a display device 10_8 of FIG. 18, both sides, in a first direction DR1, of each opening (OPE1, OPE2, and OPE3), which are disposed in each of first, second, third, and fourth pixels PX1, PX2, PX3, and PX4, may be curved, and both sides, in a second direction DR2, of each of the openings (OPE1, OPE2, and OPE3) may be linear. As both sides, in the first direction DR1, of each of the openings (OPE1, OPE2, and OPE3) are curved and protrude outwardly, the sides of each of the openings (OPE1, OPE2, and OPE3) can disperse the diffraction of reflected light of external light. However, since both sides, in the second direction DR2, of each of the openings (OPE1, OPE2, and OPE3) are linear, the diffraction pattern of reflected light of external light may become visible. However, if the intensity of the diffraction pattern of the reflected light is not too high, the shape of the sides of each of the openings (OPE1, OPE2, and OPE3) can be simplified, and as a result, any product defects that may be caused by the limit resolution of a patterning process for forming the openings (OPE1, OPE2, and OPE3) can be minimized.

Third emission areas EA3 may be divided into first sub-emission areas SEA1, second sub-emission areas SEA2, and third sub-emission areas SEA3, and second emission areas EA2 may be divided into fourth sub-emission areas SEA4 and fifth sub-emission areas SEA5. Two second openings OPE2 and three third openings OPE3 may be disposed in each of the first, second, third, and fourth pixels PX1, PX2, PX3, and PX4. The two second openings OPE2 may be spaced apart from each other in the second direction DR2, and the three third openings OPE3 may be spaced apart from one another in the second direction DR2. The second openings OPE2 and the third openings OPE3 may be smaller in size than first openings OPE1.

One first sub-emission area SEA1, one second sub-emission area SEA2, and one third sub-emission area SEA3 may form one third emission area EA3 and may be disposed to overlap a pixel electrode AE of a light-emitting element ED and with a third color filter CF3. The first sub-emission areas SEA1, the second sub-emission areas SEA2, and the third sub-emission areas SEA3 are illustrated as being separate parts of the third emission areas EA3, but may actually be emission areas emitting light of substantially the same color. One fourth sub-emission area SEA4 and one fifth sub-emission area SEA5 may form one second emission area EA2 and may be disposed to overlap a pixel electrode AE of a light-emitting element ED and with a second color filter CF2. The fourth sub-emission areas SEA4 and the fifth sub-emission areas SEA5 are illustrated as being separate parts of the second emission areas EA2, but may actually be emission areas emitting light of substantially the same color.

Referring to a display device 10_9 of FIG. 19, first emission areas EA1, second emission areas EA2, and third emission areas EA3 or first openings OPE1, second openings OPE2, and third openings OPE3 may have different shapes. For example, both sides, in a first direction DR1, of each of the first openings OPE1 (or the first emission areas EA1) may be curved, and both sides, in a second direction DR2, of each of the first openings OPE1 (or the first emission areas EA1) may be inwardly depressed. Each of both sides, in the second direction DR2, of each of the first openings OPE1 (or the first emission areas EA1) may have a similar pattern width BW to an opening width OPL of the first openings OPE1 (or the first emission areas EA1) and may include one concave or engraved portion.

Each of both sides, in the first direction DR1, of the second openings OPE2 (or the second emission areas EA2) may include one concave portion, and each of the second openings OPE2 may have protruding corners with curvature. Each of both sides, in the first or second direction DR1 or DR2, of each of the second openings (or the second emission areas EA2) may have a similar pattern width BW to an opening width OPL of the second openings (or the second emission areas EA2) and may include one concave portion.

Each of both sides, in the first direction DR1, of the third openings OPE3 (or the third emission areas EA3 may have a smaller pattern width BW than an opening width OPL of the third openings OPE3 (or the third emission areas EA3) and may include one or more concave portions, and each of both sides, in the second direction DR2 of the third openings OPE3 (or the third emission areas EA3) may have a similar pattern width BW to the opening width OPL of the third openings OPE3 (or the third emission areas EA3) and may include one concave portion. Since emission areas (EA1, EA2, and EA3) or openings (OPE1, OPE2, and OPE3) of the display device 10_9 have different side shapes or patterns, the diffraction of light reflected from between each pair of adjacent openings can be further effectively dispersed.

According to the embodiments of FIGS. 1 through 19, the diffraction of reflected light may be dispersed by controlling the side pattern of the emission areas (EA1, EA2, and EA3) or the openings (OPE1, OPE2, and OPE3) in each pixel, but the disclosure is not limited thereto. In another embodiment, the diffraction of reflected light may be dispersed by designing the shape or side pattern of the emission areas (EA1, EA2, and EA3) or the openings (OPE1, OPE2, and OPE3) or the layout of the emission areas (EA1, EA2, and EA3) or the openings (OPE1, OPE2, and OPE3) to differ between each pair of adjacent pixels.

FIG. 20 is a schematic plan view illustrating emission areas in two adjacent pixels of a display device according to another embodiment of the disclosure.

Referring to a display device 11 of FIG. 20, the concave-convex patterns of the sides of each opening (OPE1, OPE2, and OPE3) may differ between a pair of adjacent pixels, for example, between first and second pixels PX1 and PX2. For example, in a case where each of the sides of each of the openings (OPE1, OPE2, and OPE3) of the first pixel PX1 includes concave portions and convex portions that are alternately arranged, starting with a concave portion, each of the sides of each of the openings (OPE1, OPE2, and OPE3) of the second opening PX2 may include concave portions and convex portions that are alternately arranged, starting with a convex portion. The convex-concave patterns of the sides of each of the openings (OPE1, OPE2, and OPE3) of the first pixel PX1 may be opposite to the convex-concave patterns of the sides of each of the openings (OPE1, OPE2, and OPE3) of the second pixel PX2.

For example, one side, in a first direction DR1, or the left side of a first opening OPE1 of the first pixel PX1 may have a concave portion positioned at the top thereof and a convex portion connected to the concave portion, from below the concave portion, but one side, in a first direction DR1, or the left side of a first opening OPE1 of the second pixel PX2 may have a convex portion positioned at the top thereof and a concave portion connected to the convex portion, from below the convex portion. The left sides of the first openings OPE1 of the first and second pixels PX1 and PX2 may have opposite phases.

As the sides of each of the openings (OPE1, OPE2, and OPE3) of the first pixel PX1 have an opposite phase to the sides of each of the openings (OPE1, OPE2, and OPE3) of the second pixel PX2, beams of light reflected from each pair of adjacent pixels, for example, the first and second pixels PX1 and PX2, may not interfere with each other. As a result, the intensity of reflected light of external light may weaken, and the diffraction pattern of the reflected light may become almost invisible to a user.

FIG. 21 is a schematic plan view illustrating emission areas in two adjacent pixels of a display device according to another embodiment of the disclosure.

Referring to a display device 11_1 of FIG. 21, the directions faced by the concave-convex patterns of the sides of each opening (OPE1, OPE2, and OPE3) may differ between each pair of adjacent pixels, for example, between first and second pixels PX1 and PX2. In the display device 11_1, like in the display device 10_7 of FIG. 17, each of the openings (OPE1, OPE2, and OPE3) may have protruding corners with curvature, and the sides of each of the openings (OPE1, OPE2, and OPE3) may be linear between the protruding corners. The directions faced by the protruding corners of each of the openings (OPE1, OPE2, and OPE3) may differ from the first pixel PX1 to the second pixel PX2.

For example, the corners of a first opening OPE1 (or a first emission area EA1) of the first pixel PX1 may face diagonal directions, and the corners of a first opening OPE1 (or a first emission area EA1) of the second pixel PX2 may face first and second directions DR1 and DR2. For example, the corners of a third opening OPE3 (or a third emission area EA3) of the first pixel PX1 may face the first and second directions DR1 and DR2, and the corners of a third opening OPE3 (or a third emission area EA3) of the second pixel PX2 may face the diagonal directions.

FIGS. 22 and 23 are schematic plan views illustrating emission areas and color filters in pixels of display devices according to other embodiments of the disclosure.

Referring to a display device 12 of FIG. 22, not only the sides of each of first, second, and third openings OPE1, OPE2, and OPE3 of a pixel-defining film PDL, but also the sides of each of first, second, and third holes OPT1, OPT2, and OPT3 of a light-blocking layer BM may have concave-convex patterns. The concave-convex patterns of the sides of each of the first, second, and third holes OPT1, OPT2, and OPT3 may be substantially the same as the concave-convex patterns of the sides of each of the first, second, and third openings OPE1, OPE2, and OPE3.

For example, the first hole OPT1 may overlap the first opening OPE1, and the concave-convex patterns of the sides of the first hole OPT1 may be substantially the same as the concave-convex patterns of the sides of the first opening OPE1. The ratio of a pattern depth BD and a pattern width BW of the sides of the first hole OPT1 may be the same as the ratio of a pattern depth BD and a pattern width BW of the sides of the first opening OPE1. Similarly, the concave-convex patterns of the sides of the second hole OPT2 may be substantially the same as the concave-convex patterns of the sides of the second opening OPE2, and the concave-convex patterns of the sides of the third hole OPT3 may be substantially the same as the concave-convex patterns of the sides of the third opening OPE3.

Referring to a display device 12_1 of FIG. 23, not only first, second, and third holes OPT1, OPT2, and OPT3 of a light-blocking layer BM, but also first, second, and third color filters CF1, CF2, and CF3 may have sides with concave-convex patterns. The concave-convex patterns of the sides of each of the first, second, and third color filters CF1, CF2, and CF3 may be substantially the same as the concave-convex patterns of the sides of each of the first, second, and third holes OPT1, OPT2, and OPT3 or first, second, and third openings OPE1, OPE2, and OPE3.

For example, the first color filter CF1 may overlap the first hole OPT1 or the first opening OPE1, and the concave-convex patterns of the sides of the first color filter CF1 may be substantially the same as the concave-convex patterns of the sides of the first hole OPT1 or the first opening OPE1. The ratio of a pattern depth BD and a pattern width BW of the sides of the outer sides of the first color filter CF1 may be the same as the ratio of the pattern depth BD and the pattern width BW of the sides of the first hole OPT1 or the first opening OPE1. Similarly, the concave-convex patterns of the outer sides of the second color filter CF2 may be substantially the same as the concave-convex patterns of the sides of the second hole OPT2 or the second opening OPE2, and the concave-convex patterns of the outer sides of the third color filter CF3 may be substantially the same as the concave-convex patterns of the sides of the third hole OPT3 or the third opening OPE3. Since not only the first, second, and third openings OPE1, OPE2, and OPE3 of the pixel-defining film PDL, but also the first, second, and third holes OPT1, OPT2, and OPT3 of the light-blocking layer BM and the first, second, and third color filters CF1, CF2, and CF3 have sides with concave-convex patterns, the diffraction of reflected light of external light can be further effectively dispersed. Also, the display device 12 can make a diffraction pattern that may be formed by the reflection of external light almost invisible and can provide a more satisfying feeling of use.

FIG. 22 illustrates an example in which the first, second, and third openings OPE1, OPE2, and OPE3 of the pixel-defining film PDL and the first, second, and third holes OPT1, OPT2, and OPT3 of the light-blocking layer BM have sides with concave-convex patterns, and FIG. 23 illustrates an example in which the first, second, and third color filters CF1, CF2, and CF3 also have sides with concave-convex patterns, in which case, the diffraction of reflected light can be further effectively dispersed. In another embodiment, only the first, second, and third openings OPE1, OPE2, and OPE3 of the pixel-defining film PDL or the first, second, and third color filters CF1, CF2, and CF3 may have concave-convex side patterns. In another embodiment, each of the first, second, and third openings OPE1, OPE2, and OPE3 of the pixel-defining film PDL may have relatively linear sides, and each of the first, second, and third holes OPT1, OPT2, and OPT3 of the light-blocking layer BM or the first, second, and third color filters CF1, CF2, and CF3 may have sides with concave-convex patterns. In another embodiment, at least the first, second, and third opening OPE1, OPE2, and OPE3 of the pixel-defining film PDL and the first, second, and third holes OPT1, OPT2, and OPT3 (or the first, second, and third color filters CF1, CF2, and CF3) may have sides with concave-convex patterns. Since not only the first, second, and third openings OPE1, OPE2, and OPE3 of the pixel-defining film PDL, but also other elements of the display device 10 may have sides with concave-convex patterns, the display device 12 can effectively disperse the diffraction of reflected light.

FIG. 24 is a schematic plan view illustrating emission areas and color filters in a pixel of a display device according to another embodiment of the disclosure. FIG. 25 is a schematic cross-sectional view taken along line X-X' of FIG. 24.

Referring to FIGS. 24 and 25, a display device 12_2 may further include spacers SPC, which are disposed on a pixel-defining film PDL, and the sides of each of the spacers SPC, like the sides of each of first, second, and third openings OPE1, OPE2, and OPE3, may have sides with concave-convex patterns.

The spacers SPC may be disposed on the pixel-defining film PDL to support a mask. The spacers SPC may include a different organic insulating material from the pixel-defining film PDL. In other embodiments, the spacers SPC may include a black pigment. The spacers SPC may be formed by a patterning process using a separate mask from the pixel-defining film PDL.

As the spacers SPC are formed by patterning, the sides of the spacers SPC may be formed to have concave-convex patterns. The sides of each of the spacers SPC may have a shape corresponding to the sides of each of the first, second, and third openings OPE1, OPE2, and OPE3 of the pixel-defining film PDL. As a common electrode CE is disposed on the spacers SPC, beams of light reflected from the sides of each of the spacers SPC may interfere with one another. To disperse the diffraction of reflected light from the spacers SPC, the sides of each of the spacers SPC may be formed to include concave-convex patterns.

As the sides of each of first, second, and third holes OPT1, OPT2, and OPT3 of the light-blocking layer BM, the sides of each of first, second, and third color filters CF1, CF2, and CF3, and the sides of each of the spacers SPC include concave-convex patterns, the diffraction of reflected light of external light can be further effectively dispersed. The display device 12_2 can make a diffraction pattern that may be formed by the reflection of external light almost invisible and can provide a more satisfying feeling of use.

The sides of each of the first, second, and third openings OPE1, OPE2, and OPE3 of the pixel-defining film PDL, the sides of each of the first, second, and third holes OPT1, OPT2, and OPT3 of the light-blocking layer BM, the sides of each of the first, second, and third color filters CF1, CF2, and CF3, and the sides of each of the spacers SPC are illustrated as including concave-convex patterns, but the disclosure is not limited thereto. In another embodiment, only the sides of each of the spacers SPC may include concave-convex patterns, or at least the sides of each of the spacers SPC and the sides of each of the first, second, and third openings OPE1, OPE2, and OPE3 of the pixel-defining film PDL may include concave-convex patterns. As the sides of each of the first, second, and third openings OPE1, OPE2, and OPE3, the sides of each of the first, second, and third holes OPT1, OPT2, and OPT3, the sides of each of the first, second, and third color filters CF1, CF2, and CF3, and/or the sides of each of the spacers SPC include concave-convex patterns, the diffraction of reflected light can be dispersed.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. A display device comprising:
pixel electrodes disposed on a substrate and spaced apart from one another;
a pixel-defining film disposed on the substrate and including openings, which are spaced apart from one another and overlap the pixel electrodes;
organic light-emitting layers disposed in the openings of the pixel-defining film;
a common electrode disposed between the pixel-defining film and the organic light-emitting layers;
an encapsulation layer disposed on the common electrode;
a light-blocking layer disposed on the encapsulation layer and including holes, which overlap the openings and are spaced apart from one another; and
color filters disposed in the holes of the light-blocking layer and overlapping the openings, wherein
sides of each of the openings have concave-convex patterns including convex portions that protrude outwardly and concave portions that are inwardly depressed,
the color filters are disposed to partially overlap one another on the light-blocking layer, and
a pattern depth of the openings, which is a sum of a length of the concave portions and a length of the concave portions, is about 1/40 to about 1/2 of an opening width of the openings.

2. The display device of claim 1, wherein
a pattern width of the openings, which is a pattern width of the concave portions or the convex portions, is about 1/20 to about 1/1 of the opening width of the openings.

3. The display device of claim 2, wherein the pattern depth and the pattern width are about 3 μm to about 5 μm.

4. The display device of claim 2, wherein
the openings have a same opening width in both a first direction and a second direction, which intersect each other, and
sides, in the first direction, of each of the openings have a same opening width-to-pattern width ratio as sides, in the second direction, of each of the openings.

5. The display device of claim 2, wherein
the openings have different opening widths in a first direction and a second direction, which intersect each other, and
sides, in the first direction, of each of the openings have a different opening width-to-pattern width ratio from sides, in the second direction, of each of the openings.

6. The display device of claim 2, wherein each of the sides of each of the openings includes one concave portion.

7. The display device of claim 6, wherein the pattern depth of the openings is about 1/2 of the opening width of the openings.

8. The display device of claim 2, wherein
the openings include first and second openings, which are spaced apart from each other,
an opening width of the first opening differs from an opening width of the second opening, and
a pattern width-to-opening width ratio of the first opening differs from a pattern width-to-opening width ratio of the second opening.

9. The display device of claim 1, wherein each side of each of the holes of the light-blocking layer includes convex portions that protrude outwardly and/or concave portions that are inwardly depressed to correspond to each of the sides of each of the openings.

10. The display device of claim 1, wherein each side of each of the color filters includes convex portions that protrude outwardly and/or concave portions that are inwardly depressed to correspond to each of the sides of each of the holes.

11. The display device of claim 1, wherein each side of each of the openings includes convex portions that protrude outwardly from an imaginary line extending across both ends of a corresponding side.

12. The display device of claim 1, wherein each side of each of the openings includes concave portions that are inwardly depressed from an imaginary line extending across both ends of a corresponding side.

13. The display device of claim 1, wherein each side, in a first direction, of each of the openings includes the convex portions, and each side, in a second direction, which intersects the first direction, includes the concave portions.

14. The display device of claim 1, wherein at least parts of the sides of each of the openings are linear, and each of the openings has protruding rounded corners where the sides of a corresponding opening meet.

15. The display device of claim 14, wherein the openings include a first opening and a second opening, which are spaced apart from each other, and directions faced by protruding rounded corners of the first opening differ from directions faced by protruding rounded corners of the second opening.

16. A display device comprising:

pixels arranged in a first direction and a second direction, which intersect each other, each of the pixels including openings in which light-emitting elements are arranged;

a light-blocking layer including holes, which are disposed in each of the pixels and overlap the openings; and color filters disposed in the holes of the light-blocking layer and overlapping the openings, wherein the openings include a first opening and a second opening, which are spaced apart from each other, the color filters include a first color filter and a second color filter, which overlap the first and second openings, respectively, each side of each of the first and second openings includes convex portions that protrude outwardly and/or concave portions that are inwardly depressed, the first and second color filters are disposed to overlap each other on the light-blocking layer, and a pattern depth of the openings, which is a sum of a length of the concave portions and a length of the convex portions, is about $\frac{1}{40}$ to about $\frac{1}{2}$ of an opening width of the openings.

17. The display device of claim 16, wherein a pattern width of the openings, which is a pattern width of the concave portions or the convex portions, is about $\frac{1}{20}$ to about $1/1$ of the opening width of the openings.

18. The display device of claim 17, wherein the pattern depth and the pattern width are about 3 μm to about 5 μm.

19. The display device of claim 17, wherein the pixels include a first pixel and a second pixel, which are adjacent to each other in the first direction, and positions of concave portions and convex portions of the first opening of the first pixel are opposite to positions of concave portions and convex portions of the second opening of the second pixel.

20. The display device of claim 16, wherein at least parts of the sides of each of the openings are linear, and each of the openings has protruding rounded corners where the sides of a corresponding opening meet.

21. The display device of claim 20, wherein protruding rounded corners of the first opening face the first and second directions, and protruding rounded corners of the second opening face diagonal directions between the first and second directions.

22. The display device of claim 20, wherein the pixels include a first pixel and a second pixel, which are adjacent to each other in the first direction, and directions faced by protruding rounded corners of the first opening of the first pixel differ from directions faced by protruding rounded corners of the first opening of the second pixel.

23. A display device comprising:

pixel electrodes disposed on a substrate and spaced apart from one another;

a pixel-defining film disposed on the substrate and including openings, which are spaced apart from one another and overlap the pixel electrodes;

organic light-emitting layers disposed in the openings of the pixel-defining film;

a common electrode disposed between the pixel-defining film and the organic light-emitting layers;

an encapsulation layer disposed on the common electrode;

a light-blocking layer disposed on the encapsulation layer and including holes, which overlap the openings and are spaced apart from one another;

color filters disposed in the holes of the light-blocking layer and overlapping the openings; and spacers disposed between the pixel-defining film and the common electrode, wherein sides of each of the openings have concave-convex patterns including convex portions that protrude outwardly and concave portions that are inwardly depressed, the color filters are disposed to partially overlap one another on the light-blocking layer, and each side of each of the spacers includes convex portions that protrude outwardly and concave portions that are inwardly depressed to correspond to each of the sides of each of the openings.

* * * * *